United States Patent
Ono et al.

(10) Patent No.: US 6,946,662 B2
(45) Date of Patent: Sep. 20, 2005

(54) MULTI-CHARGED BEAM LENS, CHARGED-PARTICLE BEAM EXPOSURE APPARATUS USING THE SAME, AND DEVICE MANUFACTURING METHOD

(75) Inventors: Haruhito Ono, Kanagawa (JP); Kenichi Nagae, Kanagawa (JP); Masaki Takakuwa, Tokyo (JP); Yoshinori Nakayama, Tokyo (JP); Harunobu Muto, Tokyo (JP)

(73) Assignees: Canon Kabushiki Kaisha, Tokyo (JP); Hitachi, Ltd., Tokyo (JP)

( * ) Notice: Subject to any disclaimer, the term of this patent is extended or adjusted under 35 U.S.C. 154(b) by 193 days.

(21) Appl. No.: 10/615,955

(22) Filed: Jul. 10, 2003

(65) Prior Publication Data

US 2004/0061064 A1 Apr. 1, 2004

(30) Foreign Application Priority Data

Jul. 16, 2002 (JP) ...................................... 2002-207292
Jan. 30, 2003 (JP) ...................................... 2003-022088

(51) Int. Cl.$^7$ ................................................. H01J 3/14
(52) U.S. Cl. .................................. 250/396 R; 250/398
(58) Field of Search ............................ 250/396 R, 400, 250/396 ML, 397–399

(56) References Cited

U.S. PATENT DOCUMENTS 5,291,016 A  *  3/1994  Taya  ........................... 250/292
6,617,595 B1  *  9/2003  Okunuki  ................. 250/492.22

OTHER PUBLICATIONS

T. Sasaki, *A Multibeam Scheme for Electron–Beam Lithography*, J. Vac. Sci. Technol., 19(4), Nov./Dec. 1981, pp. 963–965.

K.Y. Lee et al., *High Aspect Ratio Aligned Multilayer Microstructure Fabrication*, J. Vac. Sci, Technol. B 12(6), Nov./Dec. 1994, pp. 3425–3431.

A.D. Feinerman, et al., *Sub–centimeter Micromachined Electron Microscope*, J. Vac. Sci. Technol. A 10(4), Jul./Aug. 1992, pp 611–616.

* cited by examiner

*Primary Examiner*—John D. Lee
(74) *Attorney, Agent, or Firm*—Fitzpatrick, Cella, Harper & Scinto

(57) ABSTRACT

There is provided a multi-charged beam lens constituted by stacking, via fiber chips serving as insulator members along the optical path of a charged beam, a plurality of electrodes having a charged beam passing region where a plurality of charged beam apertures are formed. The electrodes have shield apertures between the charged beam passing region and the fiber chips. A conductive shield extends through the shield apertures without contacting the electrodes, and cuts off a straight path which connects the charged beam passing region and the fiber chips serving as insulator members. This prevents the influence of charge-up of the insulator members on an electron beam in the multi-charged beam lens.

19 Claims, 25 Drawing Sheets

A-A SECTION

VIEWED FROM LINE B-B

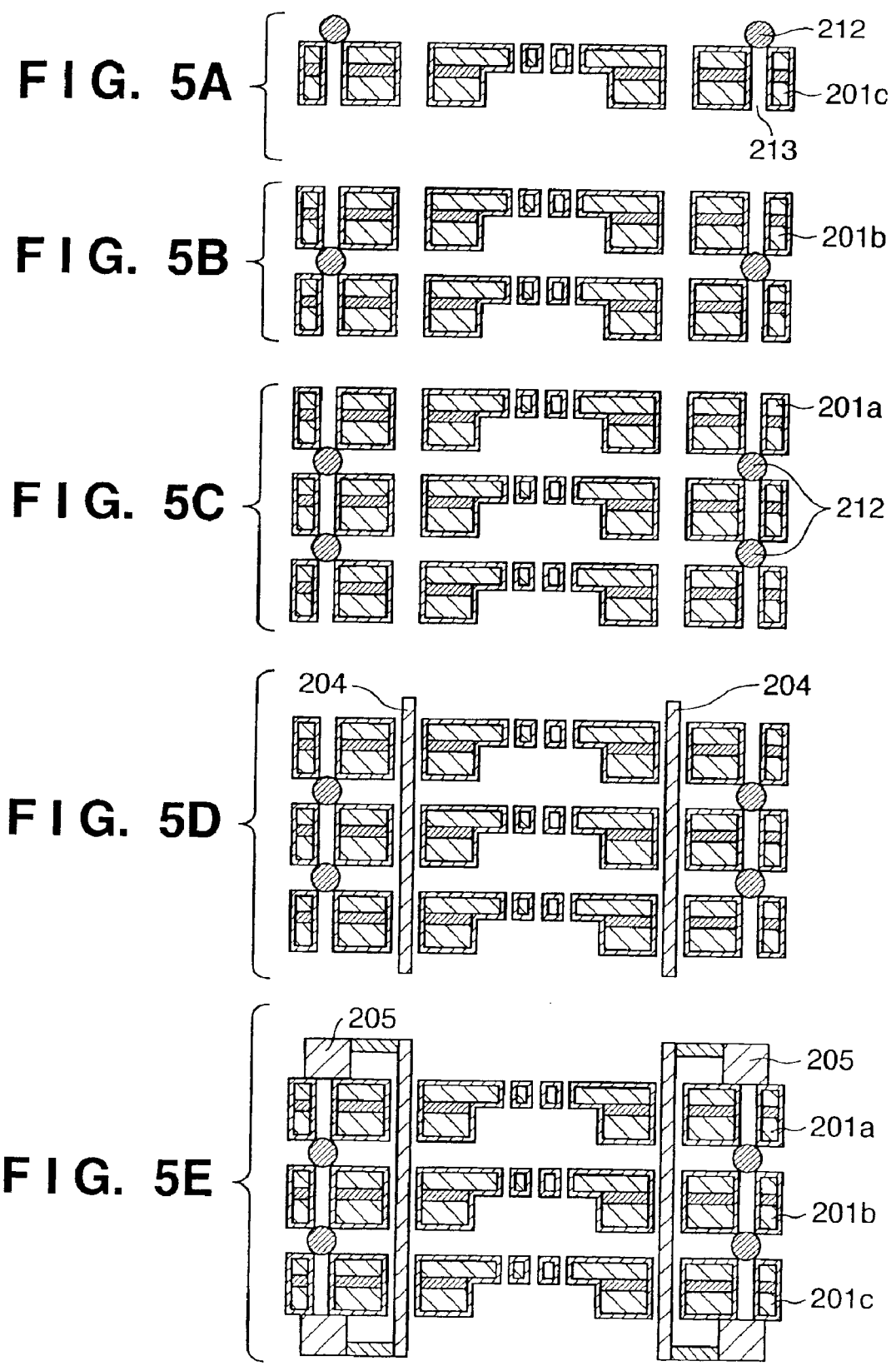

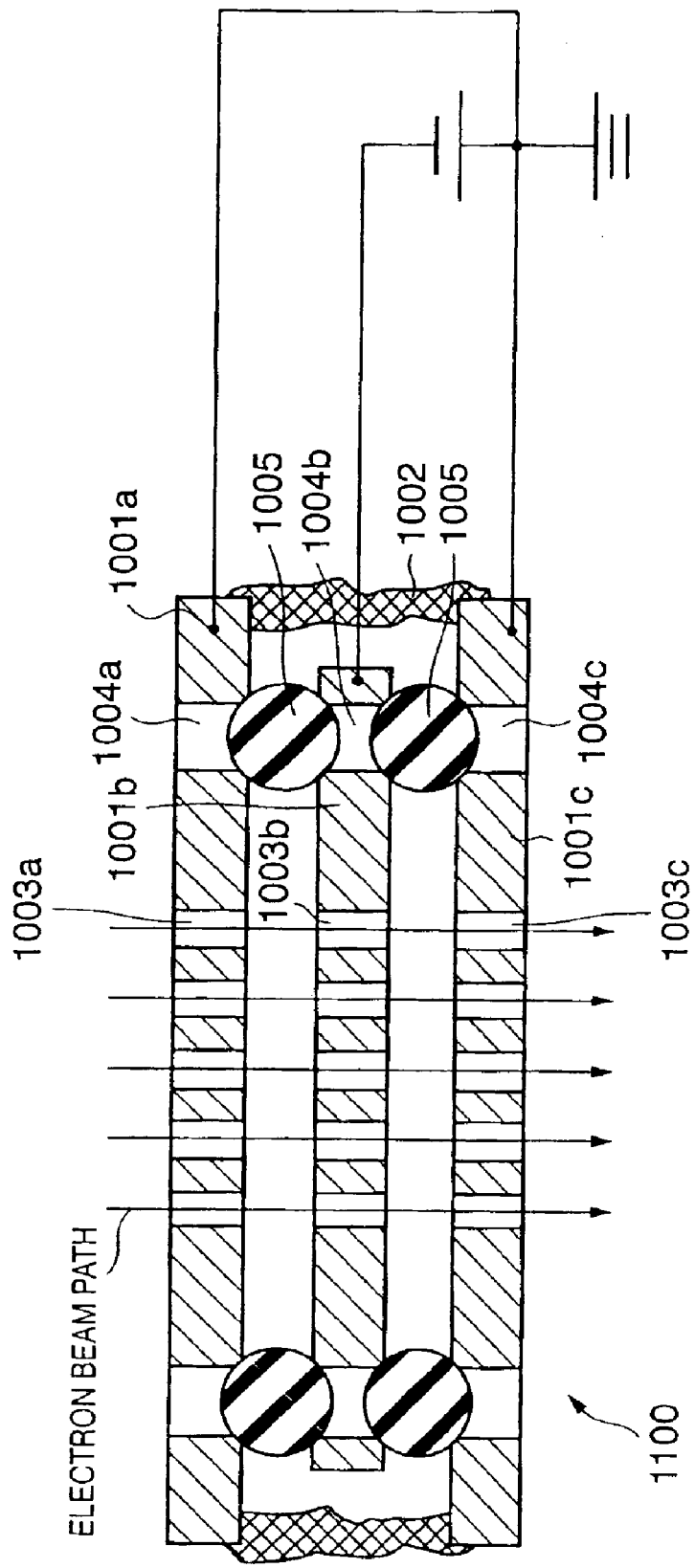

MULTI-CHARGED BEAM LENS, CHARGED-PARTICLE BEAM EXPOSURE APPARATUS USING THE SAME, AND DEVICE MANUFACTURING METHOD

FIELD OF THE INVENTION

The present invention relates to a multi-charged beam lens, charged beam exposure apparatus, and device manufacturing method, particularly, to an electron optical system adopted in an exposure apparatus using a charged particle beam such as an electron beam and, more particularly, to a multi-charged beam lens in an electron optical system array constituted by arraying a plurality of electron optical systems. The charged particle beam (to be also referred to as a charged beam) is a general term for an electron beam and ion beam.

BACKGROUND OF THE INVENTION

In production of semiconductor devices, an electron beam exposure technique receives a great deal of attention as a promising candidate of lithography capable of micropattern exposure at a line width of 0.1 $\mu$m or less, and several electron beam exposure methods have been proposed. For example, a variable rectangular beam method draws a pattern with one stroke. This method suffers many problems as a mass-production exposure apparatus because of a low throughput. To increase the throughput, there is proposed a pattern projection method of reducing and transferring a pattern formed on a stencil mask. This method is advantageous to a simple repetitive pattern but disadvantageous to a random pattern such as a logic interconnection pattern in terms of the throughput, and a low productivity disables practical application.

To the contrary, a multi-beam system for drawing a pattern simultaneously with a plurality of electron beams without using any mask has been proposed. This multi-beam system is very advantageous to practical use because of the absence of physical mask formation and exchange. What is important in using multiple electron beams in the multi-beam system is the number of electron lens arrays used in this system. The number of beams is determined by the number of electron lens arrays which can be incorporated in an electron beam exposure apparatus, and is a main factor which determines the throughput. How to improve the lens performance while downsizing the lens and increasing the density is one of important factors for improving the performance of the multi-beam exposure apparatus.

Electron lenses are classified into electromagnetic and electrostatic types. The electrostatic electron lens does not require any coil core or the like, and is simpler in structure and more advantageous to downsizing than the electromagnetic electron lens. Typical prior arts concerning downsizing of the electrostatic electron lens (electrostatic lens) are as follows.

A. D. Feinerman et al. (J. Vac. Sci. Technol. A10(4), p. 611, 1992) disclose a method of anodically bonding a fiber and a V-groove formed by Si crystal anisotropic etching of an electrode fabricated by a micromechanical technique, thereby forming a three-dimensional structure from three electrodes serving as single electrostatic lenses. The Si film has a membrane frame, a membrane, and an aperture which is formed in the membrane and transmits an electron beam. K. Y. Lee et al. (J. Vac. Sci. Technol. B12(6), p. 3,425, 1994) disclose a structure obtained by bonding Si layers and Pyrex glass layers by using anodic bonding. This technique fabricates aligned microcolumn electron lenses. Sasaki (J. Vac. Sci. Technol. 19, p. 963, 1981) discloses an arrangement in which three electrodes having lens aperture arrays are arranged into an Einzel lens. In an electrostatic lens having this arrangement, a voltage is generally applied to the central one of three electrodes, and the remaining two lenses are grounded, obtaining lens action.

In the prior arts, an electron lens is constituted by stacking a plurality of electrodes via insulator members. The insulator member which constitutes the electron lens in the prior art is exposed to an electron beam, and is readily charged. That is, an electric field is generated by charges on the insulator surface. The electric field makes the electron beam orbit unstable or increases aberration, failing to focus a beam. This is so-called charge-up. As a measure against this problem, the insulator member is covered from a beam, preventing charge-up. However, this method can be applied to only a single-beam lens. Charge-up of the insulator member is still a serious problem in a multi-charged beam lens formed using a semiconductor process.

In combining electrodes into an electron lens in the prior arts, the method by Feinerman et al. and the method by Lee et al. newly require an anodic bonding apparatus in addition to a process apparatus for fabricating an electrode. The method by Sasaki does not clarify a method of combining electrodes into an electron lens.

When electrodes are bonded to downsize an electron lens, electrodes 1001 are fixed by an adhesive 1002 via insulator members 1005, as shown in FIG. 23. The adhesive 1002 is lower in dielectric breakdown voltage than the insulator member 1005, and dielectric breakdown may occur in the adhesive 1002, decreasing the operating voltage of the electrostatic lens.

SUMMARY OF THE INVENTION

The present invention has been made to overcome at least one of the conventional drawbacks, and realizes an improvement of the prior art.

According to one aspect of the present invention, there can be provided a multi-charged beam lens which satisfies various conditions such as a small size and high precision at a high level. More specifically, the present invention can provide an excellent multi-charged beam lens which reduces the influence of charge-up on an electron beam. Further, the present invention can provide a high-precision exposure apparatus using the multi-charged beam lens, a device manufacturing method with high productivity, and a semiconductor device production factory.

A multi-charged beam lens according to one aspect of the present invention comprises the following arrangement.

That is, a multi-charged beam lens constituted by stacking, via insulator members along an optical path of a charged beam, a plurality of electrodes having a charged beam passing region where a plurality of charged beam apertures are formed comprises in a pair of electrodes which sandwich the insulator member an aperture which is formed between the charged beam passing region and the insulator member in a surface of at least one electrode that faces the other electrode, and a conductive shield which enters the aperture and is arranged between the charged beam passing region and the insulator member without contacting the electrode having the aperture.

Since the insulator member is shielded by the conductive shield from the charged beam passing region, charge-up of the insulator member is effectively prevented.

According to another aspect of the present invention, there is provided a charged particle beam exposure apparatus comprising a charged particle source which emits a charged particle beam, a correction electron optical system which includes the multi-charged beam lens and forms a plurality of intermediate images of the charged particle source, a projection electron optical system which reduces and projects the plurality of intermediate images onto a wafer, and a deflector which deflects the plurality of intermediate images projected on the wafer so as to move the plurality of intermediate images on the wafer.

According to still another aspect of the present invention, there is provided a device manufacturing method using the charged particle beam exposure apparatus.

Still another aspect of the present invention prevents any dielectric breakdown in, e.g., a member for assembling a plurality of electrode substrates in consideration of the above-described background.

Still another aspect of the present invention concerns a multi-charged beam lens. The multi-charged beam lens according to the present invention comprises at least three electrode substrates each having a plurality of apertures for transmitting a charged beam, and a coupling portion which couples at least two electrode substrates that receive a common potential (e.g., ground potential) out of at least the three electrode substrates. The coupling portion is so arranged as not to contact the electrode substrate which receives a potential (e.g., negative potential) different from the common potential out of at least the three electrode substrates. This arrangement advantageously prevents any dielectric breakdown via the coupling portion.

According to a preferred aspect of the present invention, the coupling portion may include an adhesive, or may include a fixing member and an adhesive which adheres the fixing member and at least the two electrode substrates that receive the common potential. The former is effective particularly when the interval between electrode substrates to be coupled is small, and the latter is effective particularly when the interval between electrode substrates to be coupled is large.

According to another preferred aspect of the present invention, the multi-charged beam lens preferably further comprises insulator members which are interposed between at least the three electrode substrates so as to position at least the three electrode substrates. In this case, it is preferable that at least the three electrode substrates have positioning grooves, and the insulator members be arranged in the grooves. In this arrangement, for example, at least the three electrode substrates can be assembled by the coupling portion and the insulator members, facilitating assembly.

According to still another preferred aspect of the present invention, the coupling portion is preferably formed from a conductive material. In this case, for example, either of at least the two electrode substrates coupled by the coupling portion is connected to a conductor. The common potential can be applied to at least the two electrode substrates.

Still another aspect of the present invention is related to a charged beam exposure apparatus. The apparatus comprises the multi-charged beam lens, and draws a pattern on a substrate with a charged beam from the multi-charged beam lens. The charged beam exposure apparatus exhibits high insulating performance of the multi-charged beam lens, and has high reliability.

Still another aspect of the present invention is related to a device manufacturing method. The method comprises steps of drawing a pattern on a substrate coated with a photosensitive agent by the charged beam exposure apparatus, and developing the substrate bearing the pattern.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 5A to 5E are sectional views for explaining the assembly of the multi-charged beam lens according to the first embodiment;

FIG. 18 is a sectional view for explaining the structure of a multi-charged beam lens according to the fifth embodiment of the present invention;

DETAILED DESCRIPTION OF THE PREFERRED EMBODIMENTS

Preferred embodiments of the present invention will now be described in detail in accordance with the accompanying drawings.

[First Embodiment]

<Description of Building Components of Electron Beam Exposure Apparatus>

An electron beam exposure apparatus to which a multi-charged beam lens according to the present invention can be applied will be explained.

Figure 10:
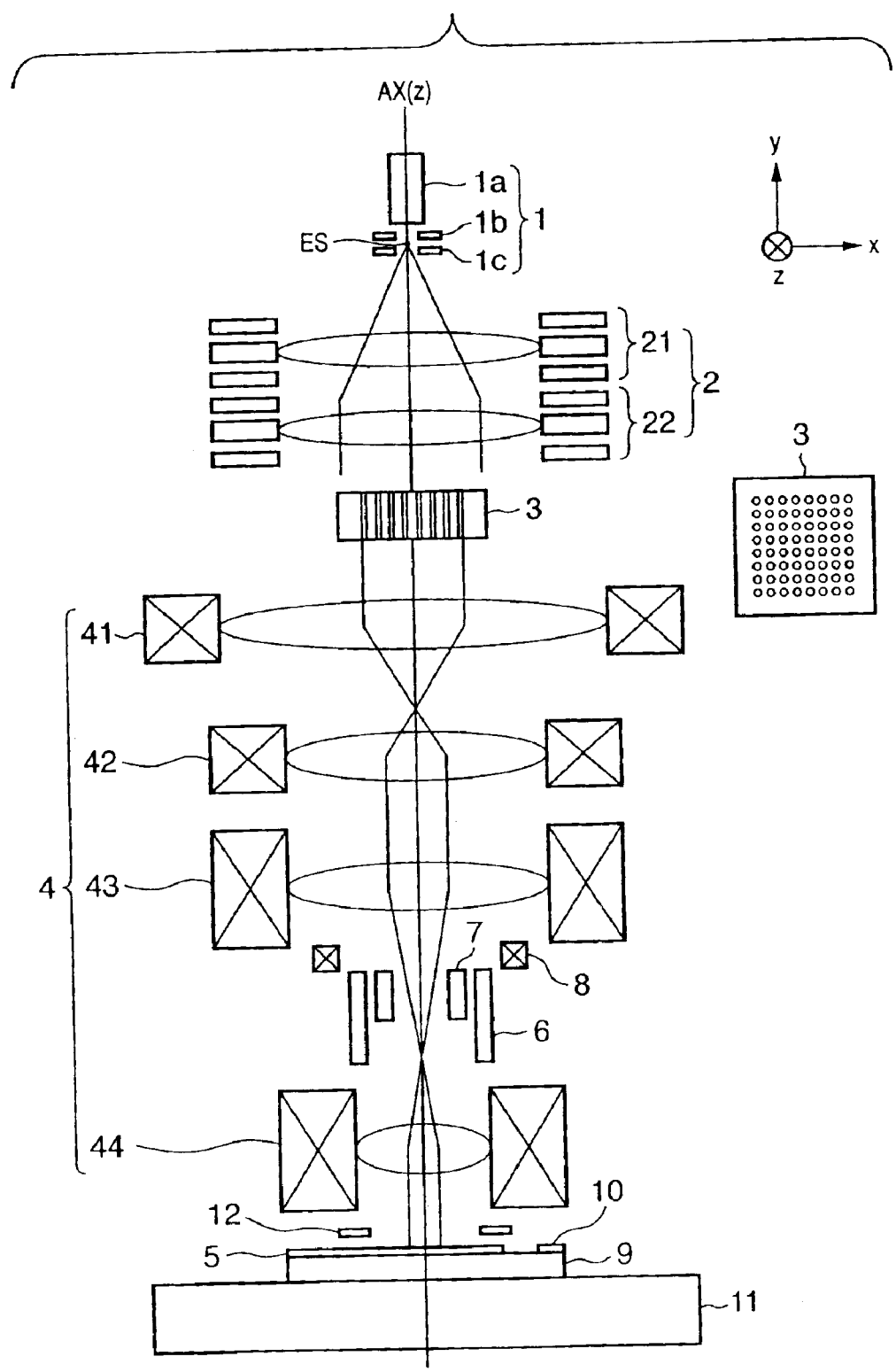
FIG. 10 is a schematic view showing the whole arrangement of a multi-charged beam exposure apparatus.

FIG. 10 is a schematic view showing the main part of the electron beam exposure apparatus according to the first embodiment. In FIG. 10, reference numeral 1 denotes an electron gun which serves as a charged particle source and comprises a cathode 1a, grid 1b, and anode 1c. In the electron gun 1, electrons emitted by the cathode 1a form a crossover image (the crossover image will be referred to as an electron source hereinafter) between the grid 1b and the anode 1c.

Electrons emitted by the electron gun 1 are substantially collimated into one electron beam by a condenser lens 2 whose front focal position is the electron source position. The condenser lens 2 is constituted by, e.g., two electron lenses 21 and 22. More specifically, the condenser lens 2 according to the first embodiment has two unipotential lenses (21 and 22) each having three aperture electrodes. The electron beam substantially collimated by the condenser lens 2 enters a correction electron optical system 3. The correction electron optical system 3 includes an aperture array, blanker array, multi-charged beam lens, element electron optical system array unit, and stopper array. Details of the correction electron optical system 3 will be described later.

In the correction electron optical system 3, a correction electron optical system array 503 includes a plurality of electron lenses (element electron optical systems) which are arranged two-dimensionally. These electron lenses form a plurality of intermediate images of an electron source (light source). Each intermediate image is reduced and projected onto a wafer 5 via a reduction electron optical system 4 (to be described later), forming a light source image (electron source image) on the wafer 5. At this time, the correction electron optical system 3 forms a plurality of intermediate images such that the interval of a light source image on the wafer 5 becomes an integer multiple of the light source image size. The correction electron optical system 3 changes the formation position of each intermediate image along the optical axis in accordance with the curvature of field of the reduction electron optical system 4. The correction electron optical system 3 corrects in advance aberration generated when each intermediate image is reduced and projected onto the wafer 5 via the reduction electron optical system 4.

The reduction electron optical system 4 includes two symmetrical magnetic tablets, and each symmetrical magnetic tablet is comprised of a first projection lens 41 (43) and second projection lens 42 (44). Letting f1 be the focal length of the first projection lens 41 (43), and f2 be the focal length of the second projection lens 42 (44), the distance between the two lenses is f1+f2. The object point on an optical axis AX is the focal position of the first projection lens 41 (43), and the image point is the focal position of the second projection lens 42 (44). This image is reduced to −f2/f1. The magnetic fields of the two, first and second projection lenses are so determined as to act in opposite directions. Seidel's aberrations and chromatic aberrations concerning rotation and magnification are theoretically canceled except for five aberrations: spherical aberration, isotropic astigmatism, isotropic coma, curvature of field, and longitudinal chromatic aberration.

Reference numeral 6 denotes a deflector which deflects a plurality of electron beams from the correction electron optical system 3 and displaces a plurality of electron source images on the wafer 5 by almost the same displacement amount in the X and Y directions. Although not shown, the deflector 6 is comprised of a main deflector which deflects a plurality of electron beams at a large deflection width, and a sub-deflector which deflects a plurality of electron beams at a small deflection width. Typically, the main deflector is an electromagnetic deflector, and the sub-deflector is an electrostatic deflector.

Reference numeral 7 denotes a dynamic focus coil which corrects a shift in the focal position of an electron source image caused by deflection aberration generated upon operating the deflector 6; and 8, a dynamic stigmatic coil which corrects astigmatism of deflection aberration generated by deflection, similar to the dynamic focus coil 7.

Reference numeral 9 denotes a θ-Z stage which supports a wafer and is movable in the optical axis AX (Z-axis) direction and the rotational direction around the Z-axis. The wafer (substrate) 5 coated with a photosensitive agent is set on the θ-Z stage 9. A stage reference plate 10 and Faraday cup 13 are fixed to the θ-Z stage 9. The Faraday cup 13 detects the charge amount of a light source image formed by an electron beam from the correction electron optical system 3. Reference numeral 11 denotes an X-Y stage which supports the θ-Z stage and is movable in the X and Y directions perpendicular to the optical axis AX (Z-axis); and 12, a reflected-electron detector which detects electrons reflected when irradiating a mark on the stage reference plate 10 with an electron beam.

Figure 11A:
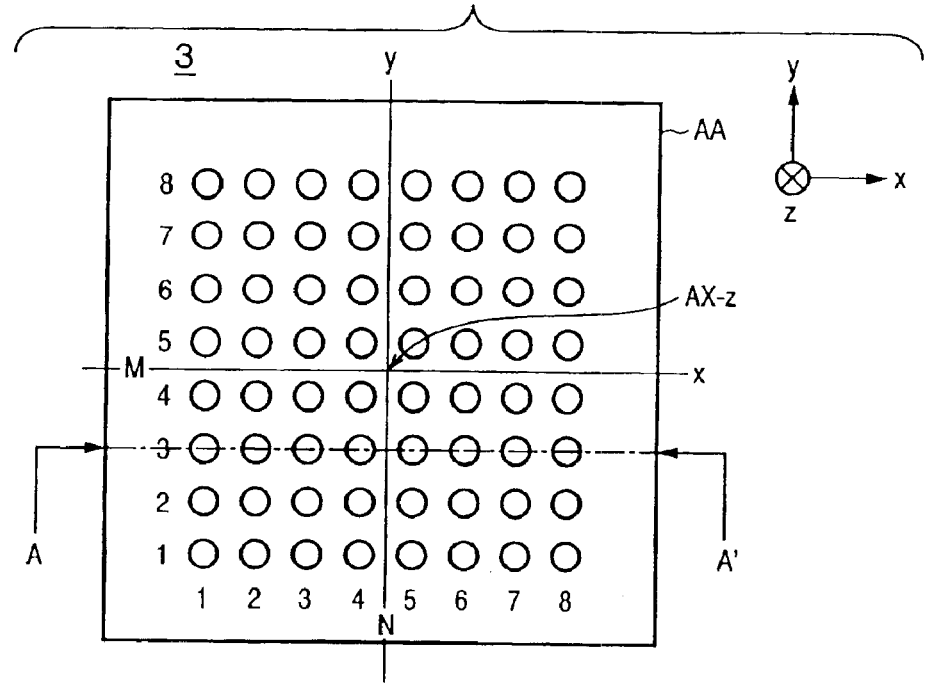
FIGS. 11A and 11B are views for explaining details of a correction electron optical system.
Figure 11B:
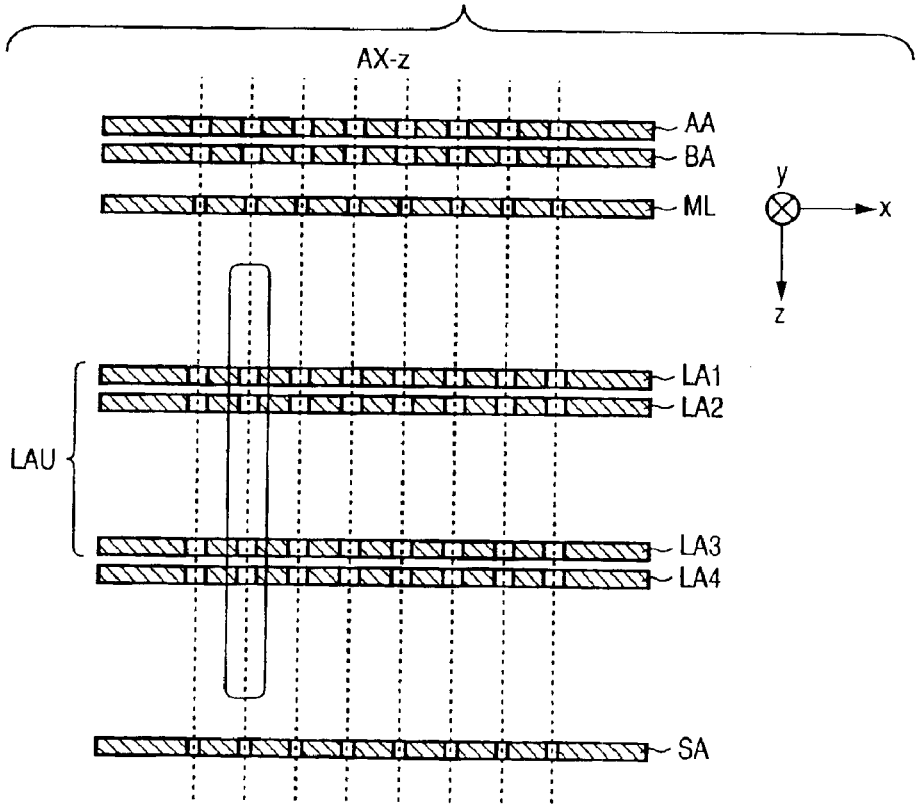

The correction electron optical system 3 will be explained with reference to FIGS. 11A and 11B. FIG. 11A is a plan view showing the correction electron optical system 3 when viewed from the electron gun 1, and FIG. 11B is a sectional view taken along the line A–A' in FIG. 11A.

As described above, the correction electron optical system 3 comprises an aperture array AA, blanker array BA, multi-charged beam lens ML, element electron optical system array unit LAU (LA1 to LA4), and stopper array SA along the optical axis AX.

The aperture array AA has a plurality of apertures formed in a substrate, and splits an almost collimated electron beam from the condenser lens 2 into a plurality of electron beams. The blanker array BA is obtained by forming on one substrate a plurality of deflectors which individually deflect a plurality of electron beams split by the aperture array AA.

Figure 12:
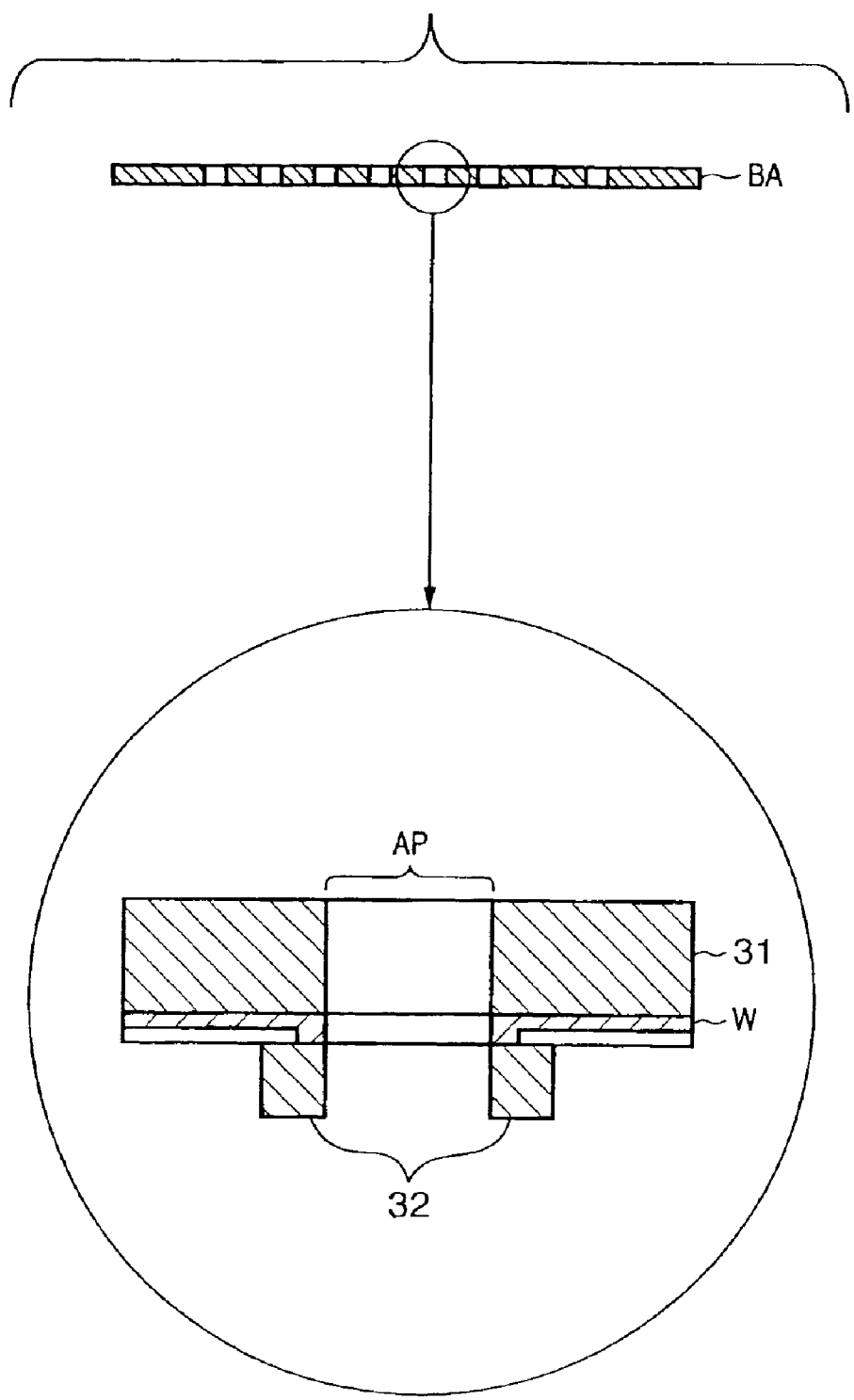
FIG. 12 is a view for explaining details of a blanker array BA shown in FIGS. 11A and 11B.

FIG. 12 shows details of one deflector. A substrate 31 has an aperture AP. Reference numeral 32 denotes a blanking electrode (blanker) which is comprised of a pair of electrodes via the aperture AP and has a deflection function. A wire W for individually turning on/off the blanker 32 is formed on the substrate 31.

Referring back to FIGS. 11A and 11B, the multi-charged beam lens ML is used to enhance charged beam convergent action in the correction electron optical system 3. The multi-charged beam lens ML according to the first embodiment takes a measure against charge-up described above. Details of the arrangement will be explained later.

The element electron optical system array unit LAU is formed from first, second, third, and fourth electron optical system arrays LA1, LA2, LA3, and LA4 which are electron lens arrays formed by two-dimensionally arraying a plurality of electron lenses arrayed within the same plane. The element electron optical system arrays LA1 to LA4 are electron lens arrays in which a plurality of electrostatic lenses are two-dimensionally arrayed within the same plane.

Figure 13:
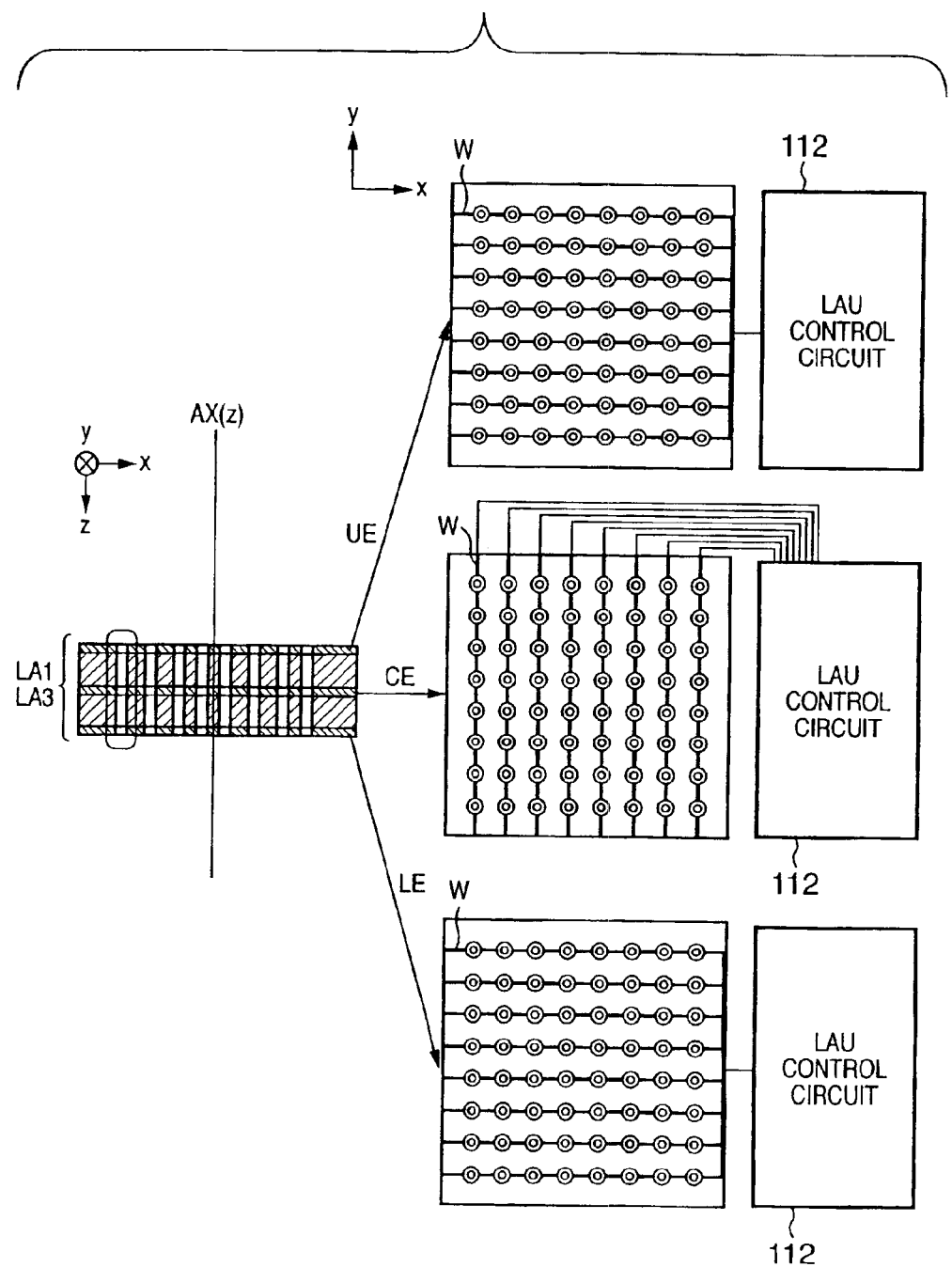
FIG. 13 is a view for explaining details of the first electron optical system array (LA1) shown in FIGS. 11A and 11B.

FIG. 13 is a view for explaining the first electron optical system array LA1. The first electron lens array LA1 is a multi-electrostatic lens having three, upper, intermediate, and lower electrodes UE, CE, and LE in each of which a plurality of apertures are arrayed. Upper, intermediate, and lower electrodes aligned along the optical axis AX constitute one electron lens EL1, i.e., so-called unipotential lens. In the first embodiment, all the upper and lower electrodes of electron optical systems are connected to the same potential and set to the same potential (in the first embodiment, set to an electron beam acceleration potential). The intermediate electrodes of electron lenses aligned in the Y direction are connected by common wires (W). As a result, the potentials of the intermediate electrodes of electron lenses aligned in the Y direction can be individually set by an LAU control circuit 112 (to be described later). The optical characteristics of electron lenses aligned in the Y direction can be set almost the same, and the optical characteristics (focal lengths) of electron lens groups aligned in the Y direction are individually set. In other words, electron lenses which are aligned in the Y direction and set to the same optical characteristic (focal length) are defined as one group. The optical characteristics (focal lengths) of groups aligned in the X direction perpendicular to the Y direction are individually set.

Figure 14:
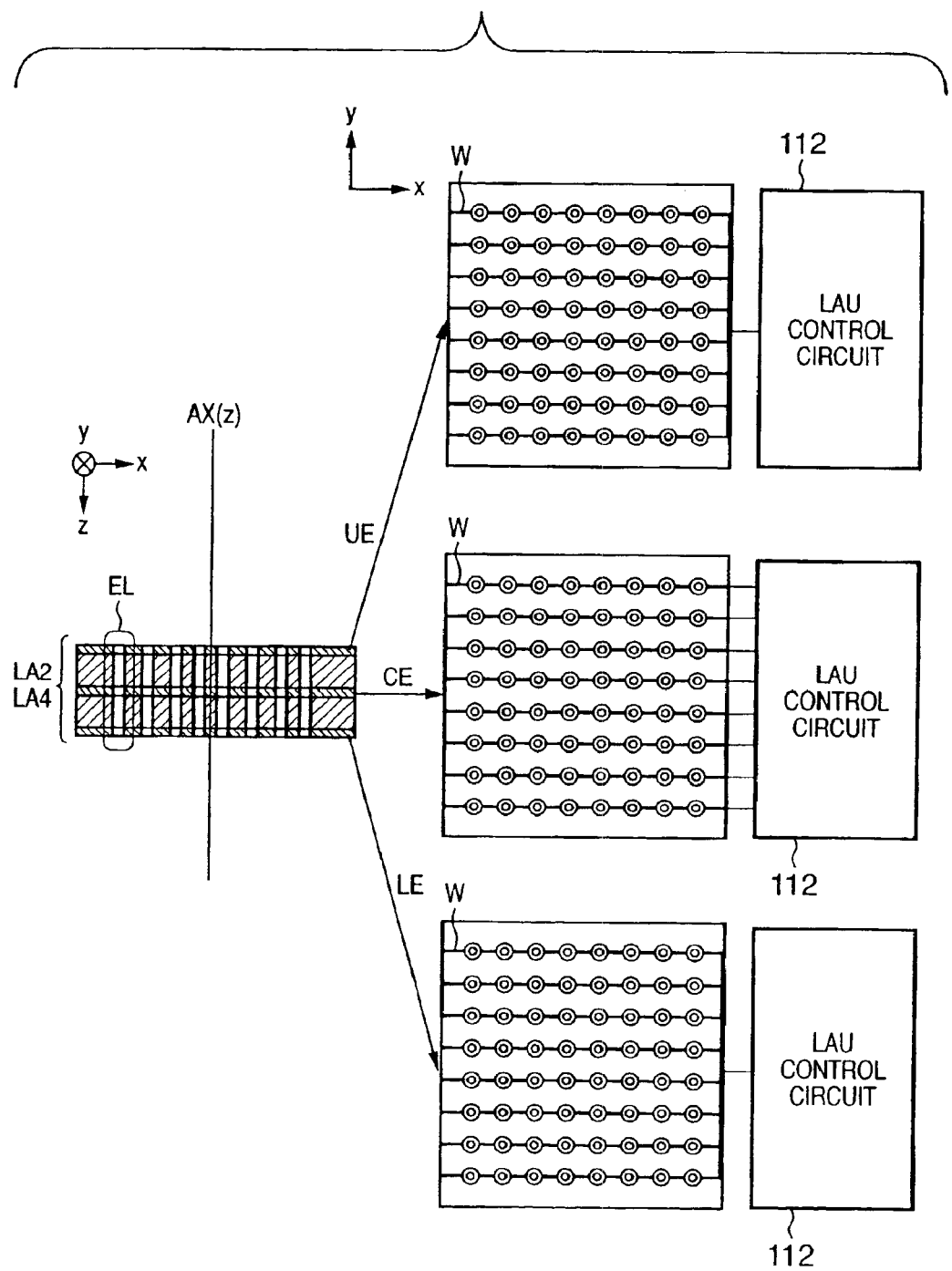
FIG. 14 is a view for explaining details of the second electron optical system array (LA2) shown in FIGS. 11A and 11B.

FIG. 14 is a view for explaining the second electron optical system array LA2. The second electron optical system array LA2 is different from the first electron optical system array LA1 in that the intermediate electrodes of electron lenses aligned in the X direction are connected by common wires (W). The potentials of the intermediate electrodes of electron lenses aligned in the X direction can be individually set by the LAU control circuit 112 (to be described later). The optical characteristics of electron lenses aligned in the X direction can be set almost the same, and the optical characteristics (focal lengths) of electron lens groups aligned in the X direction are individually set. In other words, electron lenses which are aligned in the X direction and set to the same optical characteristic (focal length) are defined as one group. The optical characteristics (focal lengths) of groups aligned in the Y direction are individually set.

The third electron optical system array LA3 is identical to the first electron optical system array LA1, the fourth electron optical system array LA4 is identical to the second electron optical system array LA2, and a description thereof will be omitted.

Action of the above-described correction electron optical system 3 on an electron beam will be explained with reference to FIG. 15.

Electron beams EB1 and EB2 split by the aperture array AA enter the element electron optical system array unit LAU via different blanking electrodes formed on the blanker array BA. The electron beam EB1 forms an intermediate image img1 of the electron source via an electron lens EL11 of the first electron optical system array LA1, an electron lens EL21 of the second electron optical system array LA2, an electron lens EL31 of the third electron optical system array LA3, and an electron lens EL41 of the fourth electron optical system array LA4. The electron beam EB2 forms an intermediate image img2 of the electron source via an electron lens EL12 of the first electron optical system array LA1, an electron lens EL22 of the second electron optical system array LA2, an electron lens EL32 of the third electron optical system array LA3, and an electron lens EL42 of the fourth electron optical system array LA4.

As described above, electron lenses aligned in the X direction in the first and third electron optical system arrays LA1 and LA3 are set to different focal lengths, and electron lenses aligned in the X direction in the second and fourth electron optical system arrays LA2 and LA4 are set to the same focal length. The focal lengths of electron lenses are set such that the synthesized focal length of the electron lenses EL11, EL21, EL31, and EL41 which transmit the electron beam EB1 and the synthesized focal length of the electron lenses EL12, EL22, EL32, and EL42 which transmit the electron beam EB2 become almost equal to each other. With this setting, the intermediate images img1 and img2 of the electron source are formed at almost the same magnification. In order to correct the curvature of field generated when each intermediate image is reduced and projected onto the wafer 5 via the reduction electron optical system 4, positions along the optical axis AX where the intermediate images img1 and img2 of the electron source are formed are determined.

Figure 15:
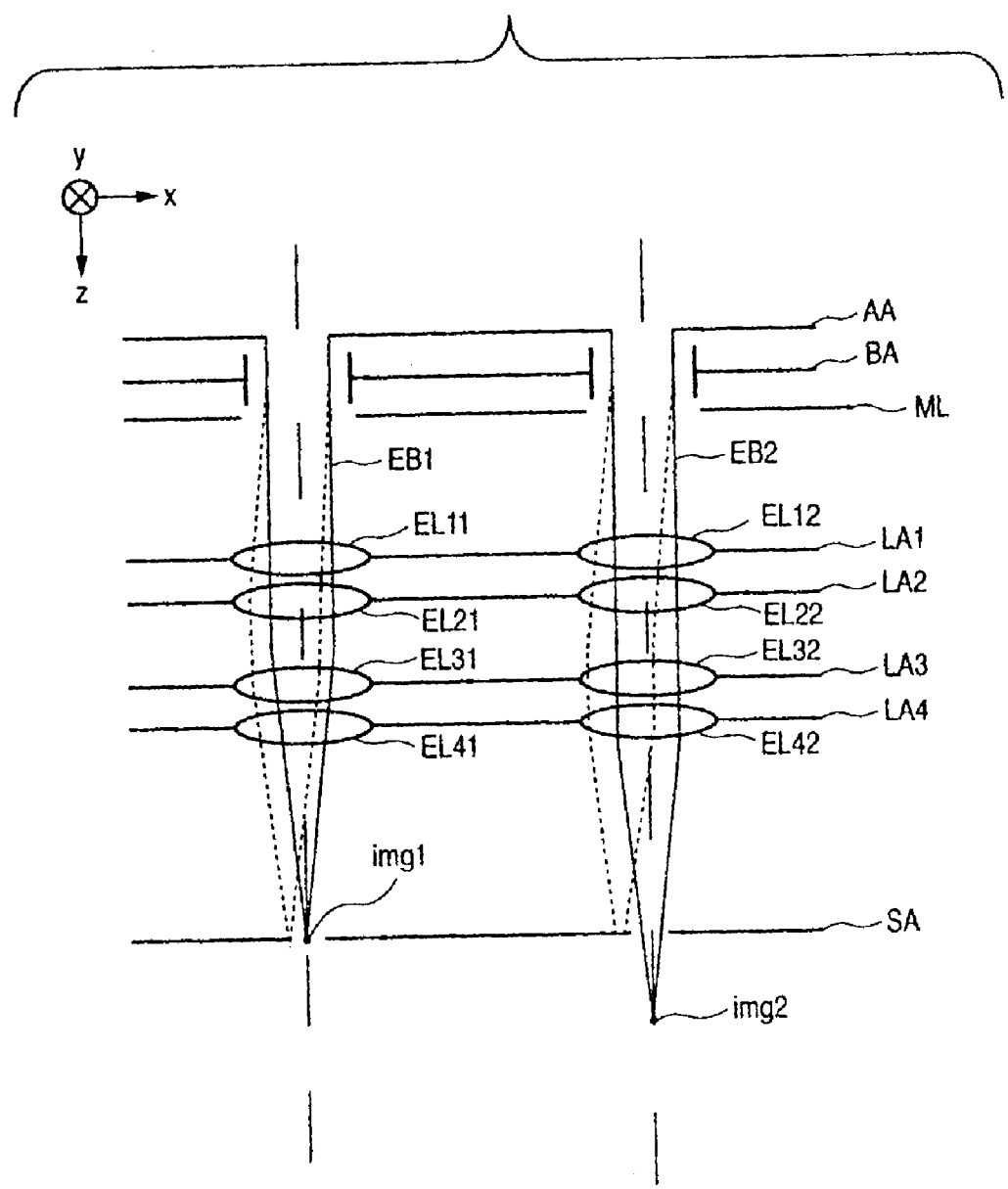
FIG. 15 is a view for explaining action of the correction electron optical system 3 on an electron beam.

When an electric field is applied to blanking electrodes which transmit the electron beams EB1 and EB2, the orbits of the electron beams EB1 and EB2 are changed, as represented by broken lines in FIG. 15. The electron beams EB1 and EB2 cannot pass through corresponding apertures of the stopper array SA, cutting off the electron beams EB1 and EB2.

Figure 16:
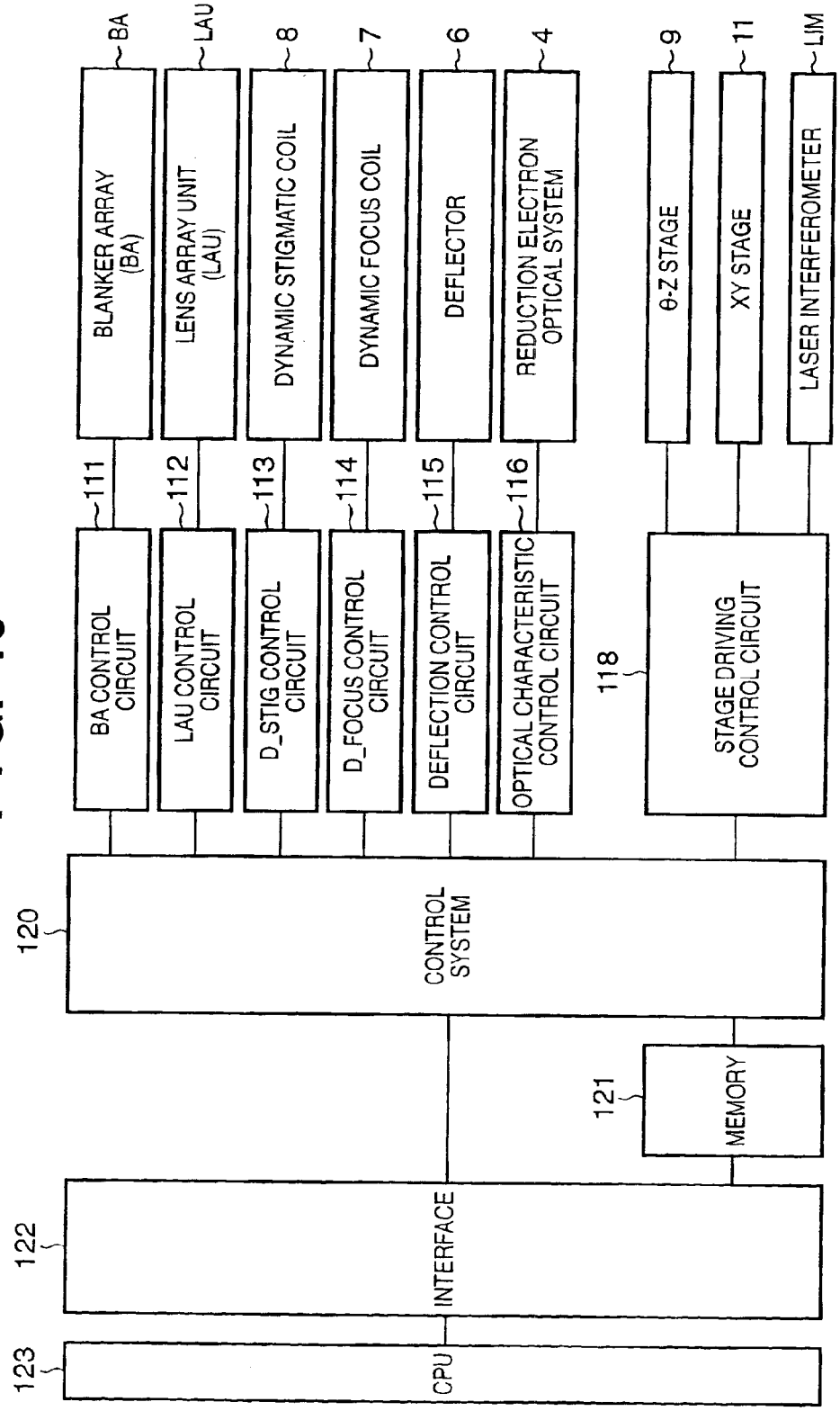
FIG. 16 is a block diagram showing the system configuration of an electron beam exposure apparatus according to the embodiment.

FIG. 16 is a block diagram showing the configuration of the control system of the electron beam exposure apparatus according to the first embodiment. A BA control circuit 111 individually controls ON/OFF operation of the blanking electrode of the blanker array BA. The LAU control circuit 112 controls the electron optical characteristic (focal length) of the lens array unit LAU.

A D_STIG control circuit 113 controls the dynamic stigmatic coil 8 to correct astigmatism of the reduction electron optical system 4. A D_FOCUS control circuit 114 controls the dynamic focus coil 7 to control the focus of the reduction electron optical system 4. A deflection control circuit 115 controls the deflector 6. An optical characteristic control circuit 116 controls the optical characteristics (magnification, distortion, rotational aberration, optical axis, and the like) of the reduction electron optical system 4.

A stage driving control circuit 117 drives and controls the θ-Z stage 9, and drives and controls the X-Y stage 11 in cooperation with a laser interferometer LIM which detects the position of the X-Y stage 11.

A control system 120 controls each control circuit on the basis of data from a memory 121 which stores a drawing pattern. The control system 120 is controlled by a CPU 123 which controls the whole electron beam exposure apparatus via an interface 122.

<Description of Exposure Operation>

Exposure operation of the electron beam exposure apparatus according to the first embodiment will be described with reference to FIGS. 16 and 17.

The control system 120 instructs the deflection control circuit 115 to deflect a plurality of electron beams by the deflector 6 on the basis of exposure control data from the memory 121. The control system 120 instructs the BA control circuit 111 to individually turn on/off the blanking electrodes of the blanker array BA in accordance with a pattern to be projected onto the wafer 5. At this time, the X-Y stage 11 continuously moves in the Y direction. The deflector 6 deflects a plurality of electron beams so as to make them follow movement of the X-Y stage.

Figure 17:
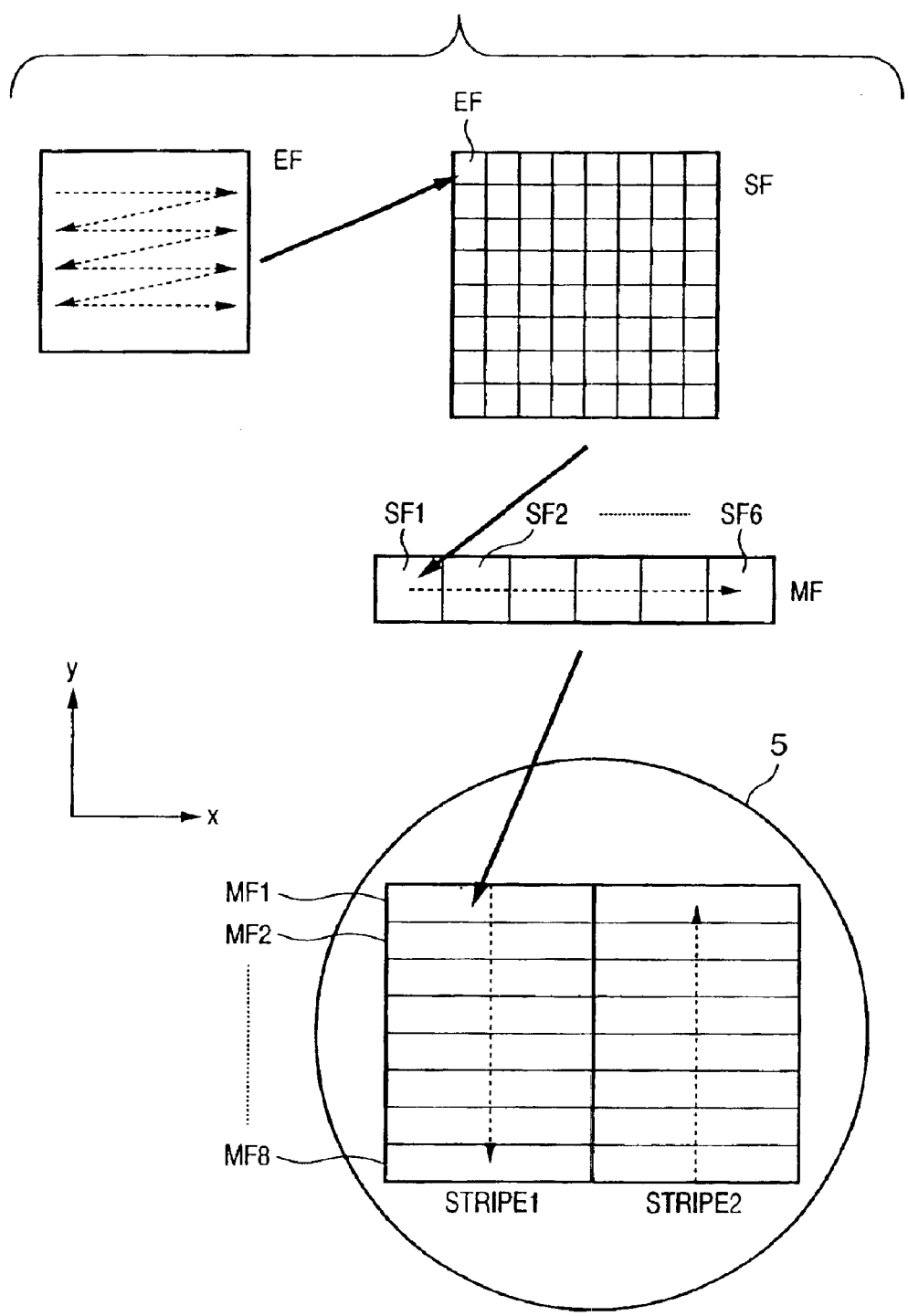
FIG. 17 is a view for explaining the exposure method of the electron beam exposure apparatus according to the embodiment.
Figure 19A:
FIGS. 19A to 19D are sectional views for explaining a method of fabricating each electrode substrate which constitutes the multi-charged beam lens according to the fifth embodiment.
Figure 19B:
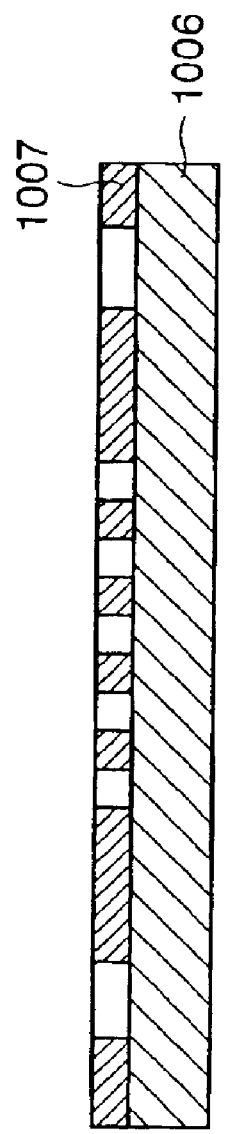
Figure 19C:
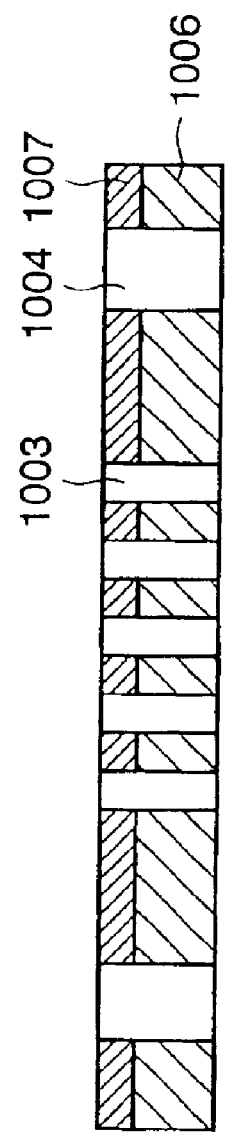
Figure 19D:
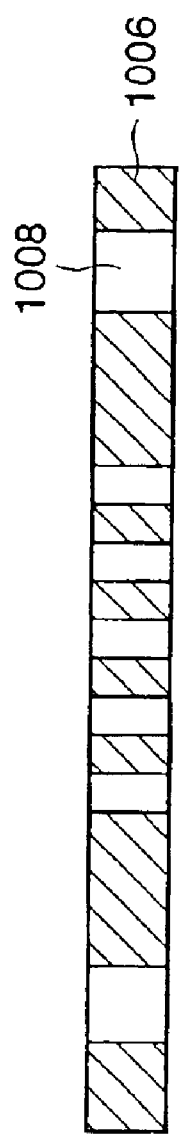

Each electron beam scans and exposes a corresponding element exposure region (EF) on the wafer 5, as shown in FIG. 17. The element exposure regions (EF) of electron beams are so set as to be two-dimensionally adjacent to each other. A subfield (SF) formed from a plurality of simultaneously exposed element exposure regions (EF) is exposed.

After one subfield (SF1) is exposed, the control system 120 instructs the deflection control circuit 115 to deflect a plurality of electron beams by the deflector 6 in a direction (X direction) perpendicular to the stage scanning direction (Y direction) in order to expose the next subfield (SF2). At this time, aberration upon reducing and projecting each electron beam via the reduction electron optical system 4 also changes along with switching of the subfield. Thus, the control system 120 instructs the LAU control circuit 112, D_STIG control circuit 113, and D_FOCUS control circuit 114 to adjust the lens array unit LAU, dynamic stigmatic coil 8, and dynamic focus coil 7 so as to correct the changed aberration. After that, corresponding element exposure regions (EF) are exposed by electron beams again in the above-describe way, exposing the subfield (SF2). By this method, as shown in FIG. 17, subfields (SF1 to SF6) are sequentially exposed, forming a pattern on the wafer 5. As a result, a main field (MF) formed from the subfields (SF1 to SF6) aligned in the direction (X direction) perpendicular to the stage scanning direction (Y direction) is exposed on the wafer 5.

After the main field 1 (MF1) shown in FIG. 17 is exposed, the control system 120 instructs the deflection control circuit 115 to deflect a plurality of electron beams and expose main fields (MF2, MF3, MF4, . . . ) aligned in the stage scanning direction (Y direction). Consequently, a stripe (STRIPE1) formed from the main fields (MF2, MF3, MF4, . . . ) is exposed, as shown in FIG. 17. The X-Y stage 11 is moved by a step in the X direction, and the next stripe (STRIPE2) is exposed.

<Multi-Charged Beam Lens>

Figure 1:
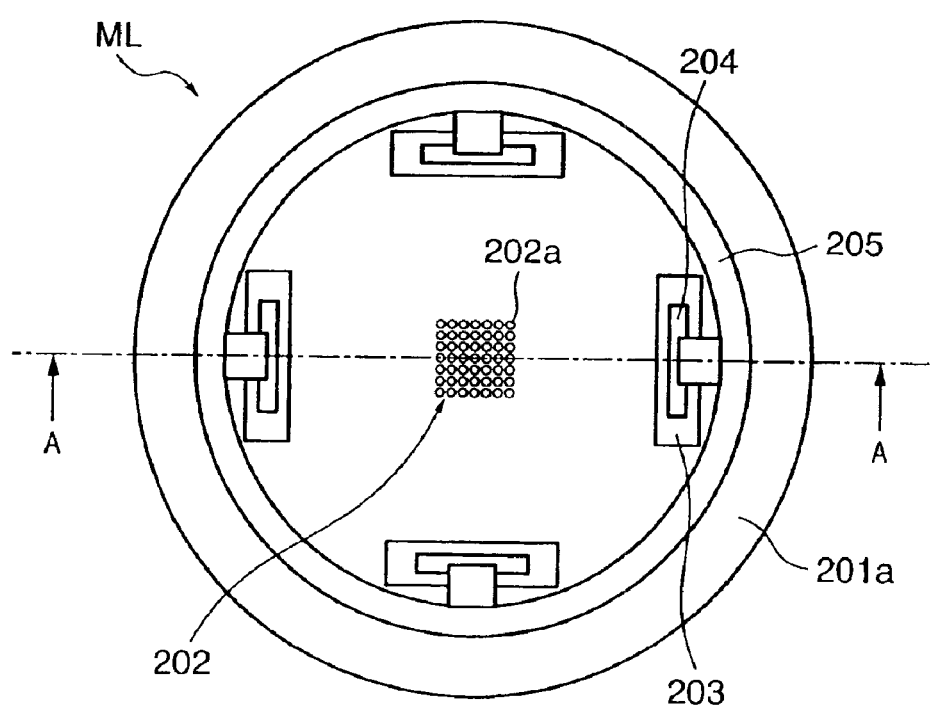
FIG. 1 is a plan view showing a multi-charged beam lens according to the first embodiment.
Figure 2A:
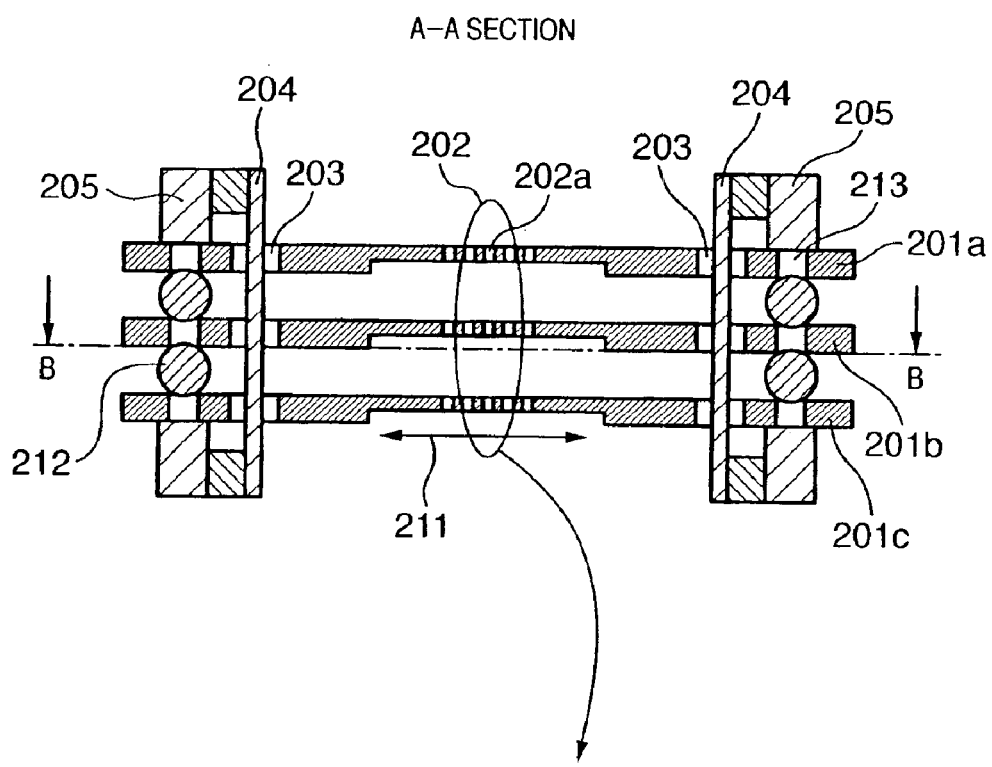
FIG. 2A is a sectional view taken along the line A—A in FIG. 1.
Figure 2B:
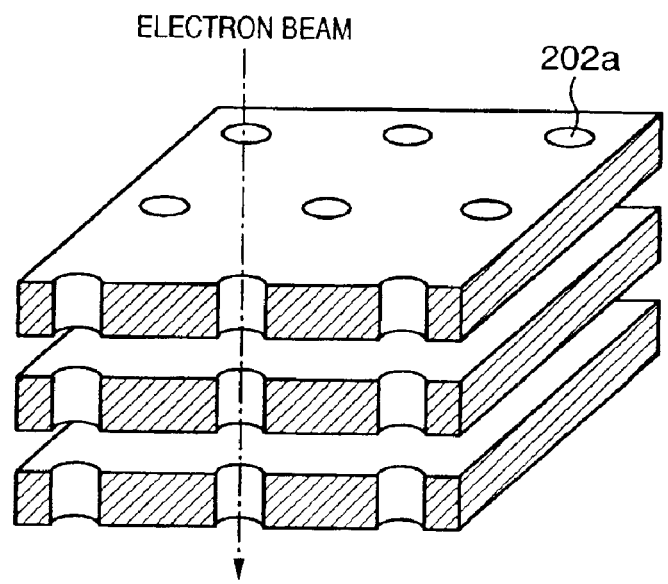
FIG. 2B is a perspective view showing details of a charged beam passing region.
Figure 3:
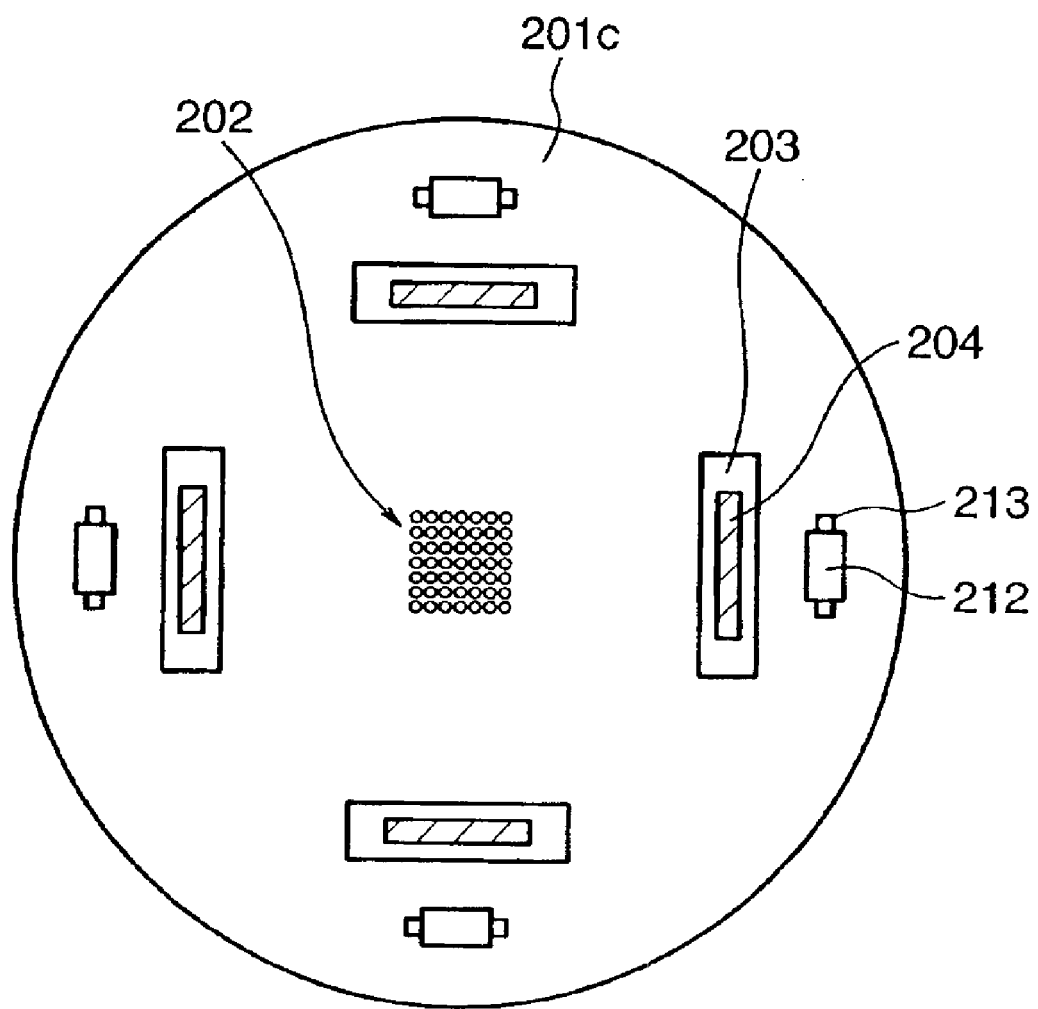
FIG. 3 is a plan view when viewed from the line B—B in FIG. 2A.

The multi-charged beam lens ML according to the first embodiment will be explained with reference to FIGS. 1 to 3. FIG. 1 is a plan view showing the multi-charged beam lens ML according to the first embodiment. FIG. 2A is a sectional view taken along the line A—A in FIG. 1. FIG. 2B is a perspective view showing a lens portion (charged beam passing region) at the center in FIG. 2A. FIG. 3 is a plan view when viewed from the line B—B in FIG. 2A.

As shown in FIGS. 1 to 3, the multi-charged beam lens ML is formed by staking three electrodes 201a to 201c via insulator members (optical fiber chips 212). That is, the multi-charged beam lens ML is formed such that the optical fiber chips 212 cut short are inserted in fiber grooves 213 formed in upper, intermediate, and lower electrodes 212a, 212b, and 212c, and are sandwiched between the three electrodes. The use of the fiber grooves 213 increases the lens assembly precision. Reference numeral 211 denotes a large aperture in the lower surface of the electrode that forms a membrane electrode 202.

The electrodes 201a to 201c have shield apertures 203, and conductive shields 204 are arranged via the apertures without contacting the electrodes. In this specification, a term "aperture" for the shield aperture means a through hole as shown in FIG. 2A and a recess to be described later with reference to FIG. 9. As shown in FIG. 2A, each shield 204 is fixed to a clamp 205 by a screw (not shown). The clamp 205 supports the shield 204, and clamps the upper electrode 201a to the lower electrode 201c immediately above and below the fiber 212, thereby assembling a multi-charged beam lens without any adhesion or bonding. Since the clamp 205 clamps the electrodes immediately above (or below) the fiber, distortion of the electrodes can be suppressed, increasing the assembly precision. This mechanical clamp structure eliminates the need for adhesion using an organic substance such as an adhesive, keeping a high vacuum degree. In general, the upper electrode 201a and lower electrode 201c are grounded, and a negative (or positive) voltage is applied to the intermediate electrode 201b, obtaining lens action on an electron beam.

As shown in FIG. 3, the shield 204 is positioned between the fiber 212 and the beam passing region 202 which transmits a charged beam. The fiber 212 is shielded from a charged beam by the shield 204. This prevents or reduces charge-up of the fiber 212 serving as an insulator member. Even if the insulator member is charged up, the influence of the electric field on a charged beam is prevented or reduced, preventing beam defocusing or a beam drift.

A method of fabricating a multi-charged beam lens having the above structure will be explained with reference to FIGS. 4A to 4F.

Figure 4A:
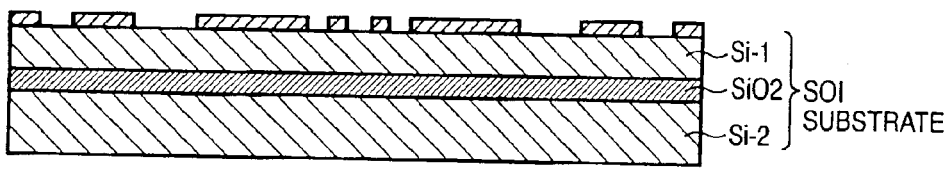
FIGS. 4A to 4E are sectional views for explaining an electrode formation process according to the first embodiment.
Figure 4B:
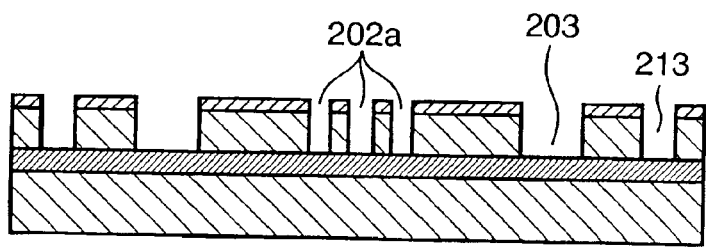
Figure 4C:
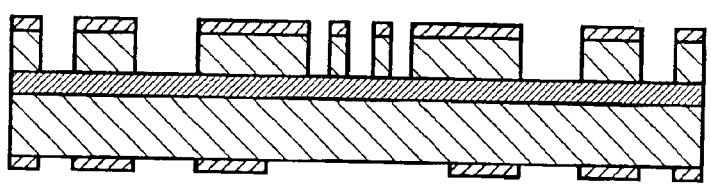
Figure 4D:
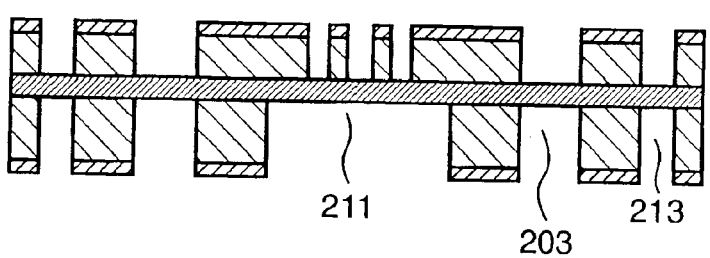
Figure 4E:
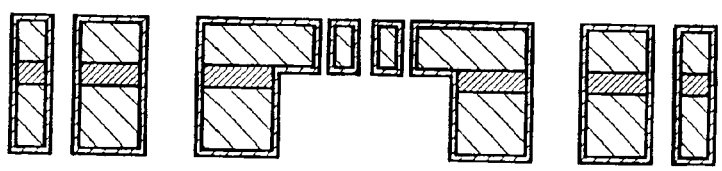

An SOI substrate having a silicon dioxide layer ($SiO_2$) between two silicon layers Si(1) and Si(2) is used, and after a photoresist is applied to Si(1), patterned (FIG. 4A). A beam aperture (202a) for transmitting a charged particle beam, a shield aperture (203) for inserting a shield, and a fiber groove (213) for positioning an optical fiber chip between electrodes are formed by Si-deep RIE (FIG. 4B). After a photoresist is similarly applied to the Si(2) surface, the SOI substrate is patterned (FIG. 4C). A large aperture (211) in the lower surface of an electrode, a shield aperture (203), and a fiber groove (213) are formed by Si-deep RIE (FIG. 4D). $SiO_2$ is etched with buffered hydrofluoric acid, and a Cr film as a contact layer and an Au film for preventing charge-up are sputtered (FIG. 4E).

The assembly of a multi-charged beam lens using three electrodes formed in the above manner will be explained with reference to FIGS. 5A to 5E.

The fiber 212 is set in the fiber groove 213 in the lower electrode 201c formed in accordance with the steps of FIGS. 4A to 4F (FIG. 5A). The intermediate electrode 201b is set such that the fiber 212 is fit in the fiber groove 213 in the lower surface of the intermediate electrode 201b (FIG. 5B). Similarly, the fiber 212 is set in the fiber groove 213 in the intermediate electrode 201b, and the upper electrode 201a is assembled (FIG. 5C). The conductive shields 204 are arranged through the shield apertures 203 of the upper, intermediate, and lower electrodes (FIG. 5D). The conductive shields 204 may be metal plates or insulator members whose surfaces bear metal films. The conductive shields 204 do not contact any of the electrodes 201a to 201c. The shields 204 are fixed to the clamp 205 by screws (not shown). The clamp 205 clamps the upper, intermediate, and lower electrodes (201a to 201c), completing the assembly of the multi-charged beam lens ML (FIG. 5E).

The multi-charged beam lens ML formed in this fashion can achieve a high precision and small size because each electrode is formed by a semiconductor process. Charge-up of the insulator member (fiber 212) can be reduced because the conductive shield 204 kept at ground potential exists between the insulator member (fiber 212) and the beam passing region 202 (portion having a plurality of beam apertures 202a). Even if the insulator member is charged up, the conductive shield 204 prevents an electric field generated by charges on the insulator surface from influencing a beam. The mechanical clamp does not use any organic substance such as an adhesive, suppressing a decrease in vacuum degree and preventing discharge.

In the first embodiment, the optical fiber ($SiO_2$) is used as an insulator member, and alignment of electrodes uses the fiber groove 213 formed by photolithography. The insulator member may be not the optical fiber but another material (e.g., alumina ceramics). Alignment is not limited to alignment using the fiber and fiber groove described above, and assembly may be executed while alignment of electrodes is confirmed by an alignment device. In this case, an insulator member in place of the fiber between electrodes may be formed into a plate shape such as a rectangular parallelepiped. Although the electrostatic lens is formed from three electrodes in the first embodiment, a lens can be generally formed from n ($n \geq 3$) electrodes. As shown in FIG. 1, the conductive shields 204 are almost axially symmetrical about the optical path of a charged particle beam, but is not limited to this. For example, the conductive shield may exist in all directions around the optical path of a charged particle beam (e.g., the conductive shield is formed annularly).

[Second Embodiment]

The second embodiment will be described with reference to FIG. 6. The first embodiment adopts the conductive shield 204 which extends through the shield aperture 203. The second embodiment concerns the structure of a multi-charged beam lens in which a projection functioning as a conductive shield is formed in each electrode. An electron beam exposure apparatus to which the multi-charged beam lens according to the second embodiment can be applied is the same as that in the first embodiment, and a description thereof will be omitted.

Figure 6:
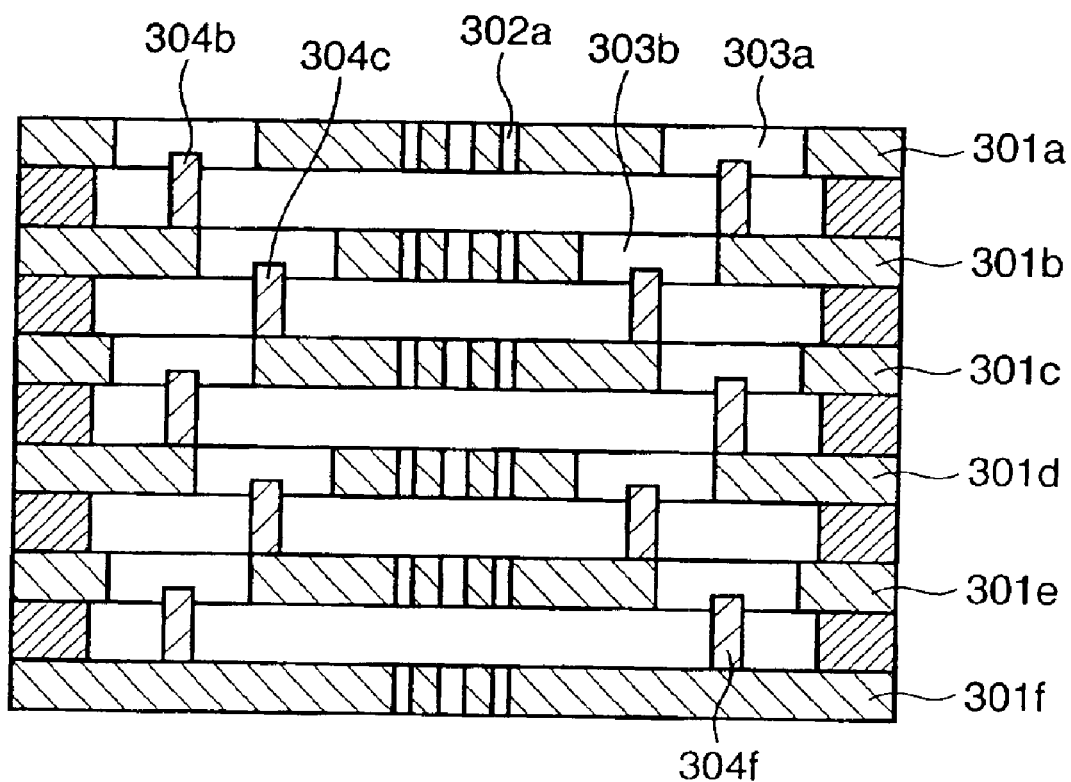
FIG. 6 is a sectional view showing a multi-charged beam lens according to the second embodiment.

FIG. 6 is a sectional view showing the multi-charged beam lens according to the second embodiment. The multi-charged beam lens according to the second embodiment uses six electrodes (upper electrode 301a, first to fourth intermediate electrodes 301b to 301e, and lower electrode 301f). In FIG. 6, the upper electrode 301a has apertures 303a for projections (shields) formed on the intermediate electrode 301b. Shields 304b serving as the projections of the intermediate electrode 301b enter the apertures 303a. Similarly, the intermediate electrode 301b has the shields 304b, and apertures 303b for the shields of the intermediate electrode 301c. Shields 304c of the intermediate electrode 301c enter the apertures 303b.

Similarly, the intermediate electrode 301c has the shields, and apertures for shields formed on the intermediate electrode 301d. The shields of the intermediate electrode 301d enter the apertures. The intermediate electrode 301d has the shields, and apertures for shields formed on the intermediate electrode 301e. The shields of the intermediate electrode 301e enter the apertures. The intermediate electrode 301e has the shields, and apertures for shields 304f formed on the lower electrode 301f. The shields 304f of the intermediate electrode 301f enter the apertures. The lower electrode 301f has the shields 304f. These shields shield rectangular parallelepiped insulator members interposed between the electrodes from a charged beam passing region. That is, all straight paths which connect the charged beam passing region and insulator members are cut off, preventing or reducing charge-up.

A method of forming the intermediate electrode (301b) out of the electrodes according to the second embodiment will be described with reference to FIGS. 7A to 7D.

Figure 7A:
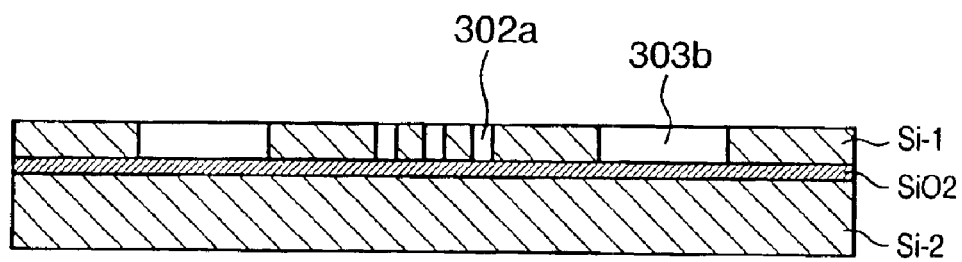
FIGS. 7A to 7D are sectional views for explaining an electrode formation process according to the second embodiment.
Figure 7B:
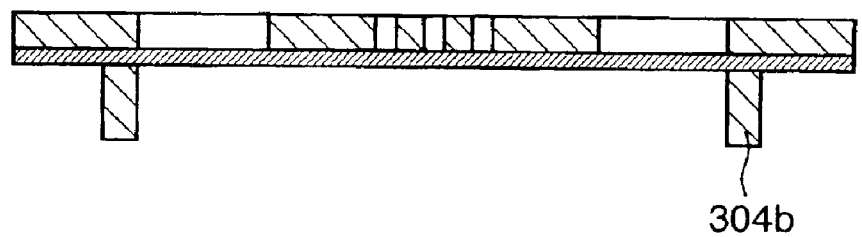
Figure 7C:
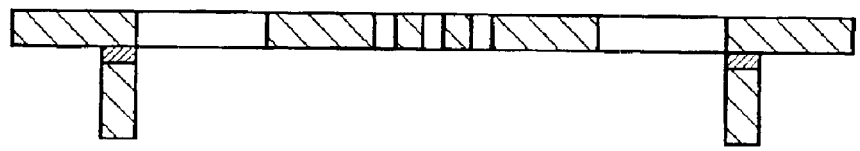
Figure 7D:
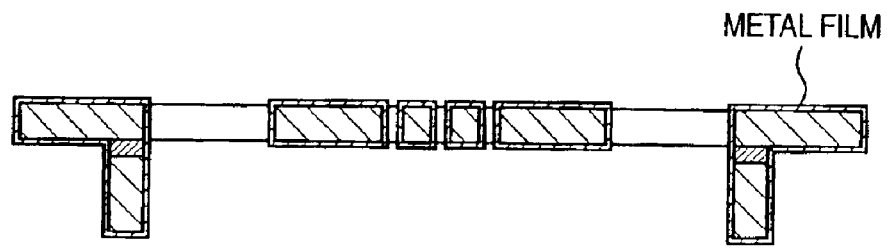

An SOI substrate having a silicon dioxide layer ($SiO_2$) between two silicon layers Si(1) and Si(2) is used, and an intermediate electrode is manufactured using a silicon semiconductor process. A beam aperture 302a for transmitting a charged particle beam, and a shield aperture 303b are formed in the silicon layer Si(1) of the SOI substrate by dry etching (FIG. 7A). By the same process, a shield 304b is formed on the silicon layer Si(2) of the SOI substrate by dry etching (FIG. 7B). The silicon dioxide layer is removed by wet etching (FIG. 7C). A metal film is sputtered onto the entire surface in order to render the electrode conductive (FIG. 7D). An electrode having another shape can also be fabricated by the same method as that of the intermediate electrode.

[Third Embodiment]

Figure 8:
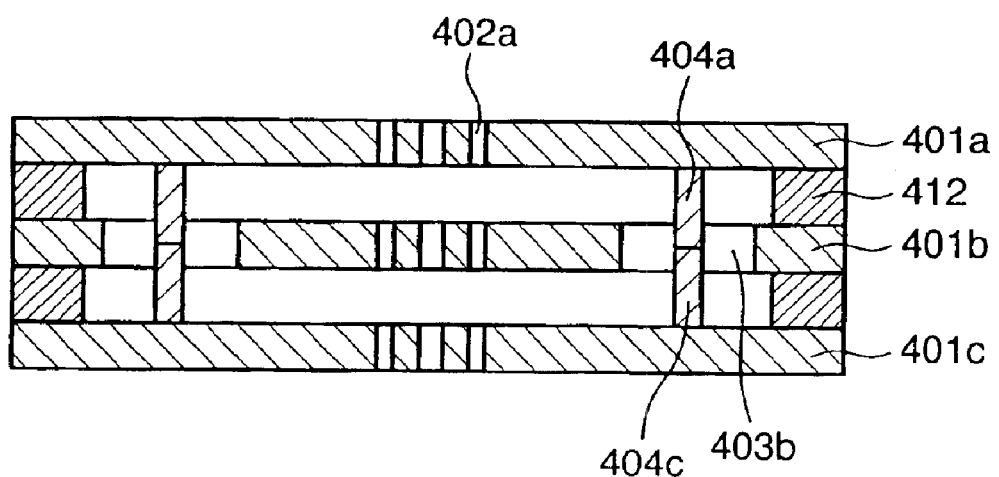
FIG. 8 is a sectional view showing a multi-charged beam lens according to the third embodiment.

FIG. 8 is a sectional view showing the structure of a multi-charged beam lens according to the third embodiment. In FIG. 8, shields 404a and 404c of upper and lower electrodes 401a and 401c are formed as projections on electrodes. The shields 404a and shields 404b shield an insulator member 412 from a beam so as to cover the insulator member 412 from a charged beam passing region. The shields 404a and 404b abut against and contact each other in corresponding shield apertures 403b of an intermediate electrode 401b. This structure can prevent charge-up of the insulator member of the multi-charged beam lens, further strengthen the multi-charged beam lens, and increase the assembly precision.

[Fourth Embodiment]

Figure 9:
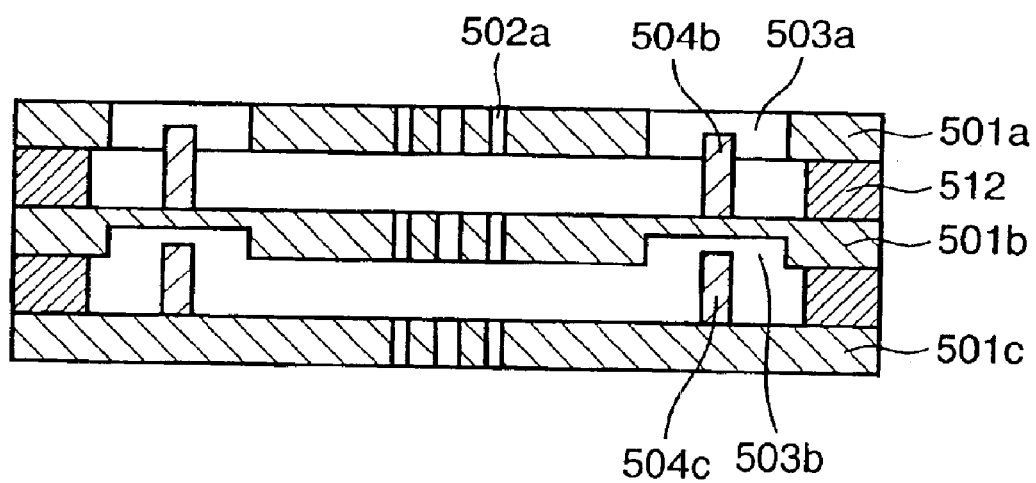
FIG. 9 is a sectional view showing a multi-charged beam lens according to the fourth embodiment.

FIG. 9 is a sectional view showing a multi-charged beam lens according to the fourth embodiment. An upper electrode 501a has shield apertures 503a, and shields 504b of an intermediate electrode 501b enter the shield apertures 503a. The intermediate electrode 501b has the shields 504b, and shield apertures (recesses) 503b so as not to contact shields 504c of a lower electrode 501c. Similar to the above-described embodiments, the fourth embodiment can prevent or reduce charge-up of an insulator member 512.

As described above, the first to fourth embodiments prevent the influence of charge-up of the insulator member of a multi-charged beam lens on an electron beam. A multi-charged beam lens which satisfies at a high level various conditions such as a small size and high precision can therefore be provided. Further, a high-precision exposure apparatus using the multi-charged beam lens, a device manufacturing method excellent in productivity, a semiconductor device production factory, and the like can be provided.

[Fifth Embodiment]

In the first to fourth embodiments, the insulator member and electron beam passing region are isolated from each other by using a conductive shield plate. In the fifth embodiment, upper and lower electrode substrates in a multi-charged beam lens are set to the same potential so as not to apply any potential difference to a coupling portion which couples the upper and lower electrodes. This prevents dielectric breakdown in the member for coupling the electrode substrates.

FIG. 18 is a sectional view schematically showing the structure of a multi-charged beam lens ML according to the fifth embodiment of the present invention. A multi-charged beam lens 1100 has a structure in which three electrode substrates 1001*a*, 1001*b*, and 1001*c* are arranged via insulator members 1005. The three electrode substrates 1001*a*, 1001*b*, and 1001*c* have assembly grooves (positioning portions) 1004*a*, 1004*b*, and 1004*c*. The insulator members 1005 are interposed between the grooves 1004*a*, 1004*b*, and 1004*c*, positioning the three electrode substrates 1001*a*, 1001*b*, and 1001*c*. In the fifth embodiment, of the upper, intermediate, and lower electrode substrates 1001*a*, 1001*b*, and 1001*c*, the upper and lower electrode substrates 1001*a* and 1001*c* receive the same potential (common potential). The multi-charged beam lens 1100 is assembled by coupling via coupling portions 1002 the upper and lower electrode substrates 1001*a* and 1001*c* which receive the same potential.

The coupling portion 1002 is so arranged as not to contact the intermediate electrode substrate 1001*b*. In this arrangement, no potential difference is applied to the coupling portion 1002, and no dielectric breakdown occurs in the member for coupling the electrode substrates. The coupling portion 1002 may be formed from, e.g., only an adhesive, a fixing member and an adhesive which adheres the fixing member and the upper and lower electrode substrates 1001*a* and 1001*c*, or a member which mechanically couples the upper and lower electrode substrates 1001*a* and 1001*c*. When the interval between electrode substrates to be coupled is small (small enough to satisfactorily couple them by, e.g., an adhesive), the coupling portion 1002 is preferably formed from only an adhesive in terms of easy assembly and a simple structure.

As shown in FIG. 18, the intermediate electrode substrate 1001*b* typically receives a negative potential with respect to the potential of the upper and lower electrode substrates 1001*a* and 1001*c*.

In the fifth embodiment, the multi-charged beam lens 1100 is comprised of three electrode substrates. However, the number of electrode substrates is not limited to three and can be arbitrarily set. In this case, the same potential is preferably applied to at least two electrode substrates at the two ends (i.e., the uppermost and lowermost electrode substrates) out of a plurality of electrode substrates. In this structure, insulator members are interposed between the electrode substrates, and the two electrode substrates at the two ends are coupled by a coupling portion, thereby fixing all the electrode substrates.

A method of fabricating the electrode substrates 1001*a*, 1001*b*, and 1001*c* shown in FIG. 18 will be explained with reference to FIGS. 19A to 19D. A silicon wafer 1006 is prepared in the step shown in FIG. 19A, and a resist is applied to the surface of the silicon wafer 1006 by spin coating in the step shown in FIG. 19B. After that, the resist is patterned in the exposure and developing steps, forming a mask 1007. In the step shown in FIG. 19C, lens apertures 1003 (1003*a*, 1003*b*, and 1003*c*) and assembly grooves 1004 (1004*a*, 1004*b*, and 1004*c*) are formed by dry etching (anisotropic etching) using the mask 1007 and etching gas such as $SF_6$ gas. Thereafter, the resist 1007 is removed. In the step shown in FIG. 19D, a conductive material such as Au is sputtered to at least the inner wall of each lens aperture 1003 of the silicon wafer 1006 and its periphery, and preferably the entire surface (including the inner surface of the lens aperture 1003) of the silicon wafer 1006, forming a conductive film 1008.

The shape and/or size of the intermediate electrode substrate 1001*b*, i.e., an electrode other than electrode substrates coupled by the coupling portion 1002 is so determined as not to contact the coupling portion 1002. The intermediate electrode 1001*b* is typically set to a size smaller than the upper and lower electrode substrates 1001*a* and 1001*c* so as to prevent the periphery of the intermediate electrode 1001*b* from contacting the coupling portion 1002.

The assembly step of the electrode substrates 1001*a*, 1001*b*, and 1001*c* fabricated in the above manner will be explained. In the assembly step, the insulator members 1005 are interposed between the groove 1004*a* of the upper electrode substrate 1001*a* and the groove 1004*b* of the intermediate electrode substrate 1001*b* and between the groove 1004*b* of the intermediate electrode substrate 1001*b* and the groove 1004*c* of the lower electrode substrate 1001*c*. The upper and lower electrodes 1001*a* and 1001*c* which receive the same potential are coupled by the coupling portion 1002 such as an adhesive. This assembly step provides the multi-charged beam lens 1100 shown in FIG. 18.

Also when a multi-charged beam lens is constituted by three or more electrode substrates, the multi-charged beam lens can be fabricated by applying the above method.

In the multi-charged beam lens 1100 shown in FIG. 18, the upper and lower electrode substrates 1001*a* and 1001*c* are grounded, and a negative voltage is applied to the intermediate electrode substrate 1001*b*, obtaining lens action on a charged beam such as an electron beam. When the coupling portion 1002 is formed from a conductive material (e.g., conductive adhesive), a conductor suffices to be connected to either of the upper and lower electrode substrates 1001*a* and 1001*c*, simplifying wiring.

In the schematic sectional view shown in FIG. 18, five electron lenses are illustrated. Electron lenses can be arranged in accordance with a one- or two-dimensional design specification. In a typical multi-charged beam lens, several hundred or several thousand electron lenses are two-dimensionally arranged.

A multi-charged beam lens manufactured by the above method can be applied to an electron beam exposure apparatus (drawing apparatus) according to the first to fourth embodiments. Each embodiment of this specification has described an exposure apparatus which adopts an electron beam as a charged beam. The present invention can also be applied to an exposure apparatus using another type of beam such as an ion beam as a charged beam.

[Sixth Embodiment]

Figure 20:
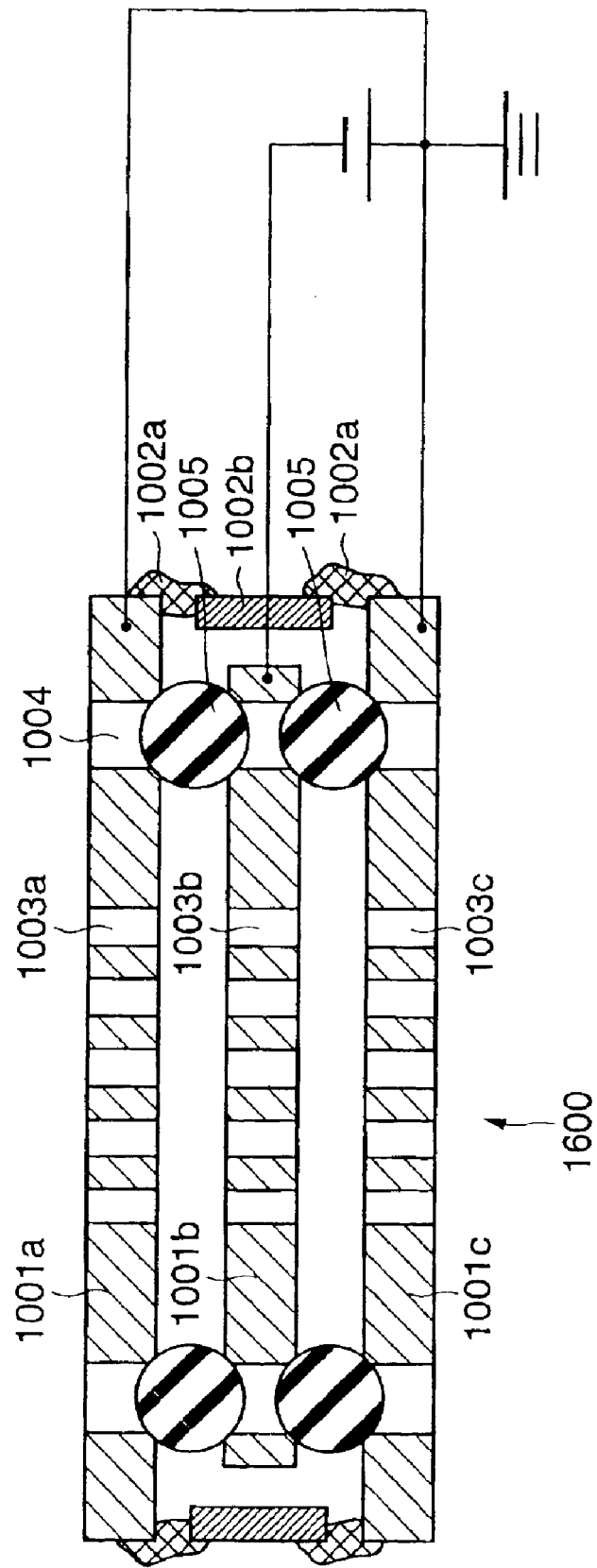
FIG. 20 is a sectional view for explaining the structure of a multi-charged beam lens according to the sixth embodiment of the present invention.

The sixth embodiment provides a concrete example in which a fixing member and an adhesive for adhering the fixing member and upper and lower electrode substrates are employed as the coupling portion 1002 in the fifth embodiment. FIG. 20 is a sectional view schematically showing the structure of a multi-charged beam lens according to the sixth embodiment of the present invention.

Similar to the fifth embodiment, a multi-charged beam lens 1600 has a structure in which three electrode substrates 1001*a*, 1001*b*, and 1001*c* are arranged via insulator members 1005. The three electrode substrates 1001*a*, 1001*b*, and 1001*c* have assembly grooves (positioning portions) 1004*a*, 1004*b*, and 1004*c*. The insulator members 1005 are interposed between the grooves 1004*a*, 1004*b*, and 1004*c*, positioning the three electrode substrates 1001*a*, 1001*b*, and 1001*c*. Of the upper, intermediate, and lower electrode substrates 1001*a*, 1001*b*, and 1001*c*, the upper and lower electrode substrates 1001*a* and 1001*c* receive the same potential. As shown in FIG. 20, the intermediate electrode substrate 1001*b* typically receives a negative potential with respect to the potential of the upper and lower electrode substrates 1001*a* and 1001*c*.

In the sixth embodiment, the multi-charged beam lens 1600 is assembled by coupling to fixing members 1002b via an adhesive 1002a the upper and lower electrode substrates 1001a and 1001c which receive the same potential. By coupling via the coupling portion (adhesive 1002a and fixing members 1002b) the upper and lower electrode substrates 1001a and 1001c which receive the same potential, no dielectric breakdown occurs in the member for coupling the electrode substrates 1001a to 1001c.

A method of fabricating the multi-charged beam lens 1600 shown in FIG. 20 will be described. A method of fabricating the electrode substrates 1001a, 1001b, and 1001c is the same as that described in the fifth embodiment with reference to FIGS. 19A to 19D.

The assembly of the electrode substrates 1001a, 1001b, and 1001c is executed as follows. The insulator members 1005 are interposed between the groove 1004a of the upper electrode substrate 1001a and the groove 1004b of the intermediate electrode substrate 1001b and between the groove 1004b of the intermediate electrode substrate 1001b and the groove 1004c of the lower electrode substrate 1001c. The upper and lower electrodes 1001a and 1001c which receive the same potential are coupled by the fixing members 1002b via the adhesive 1002a.

In the multi-charged beam lens 1600 shown in FIG. 20, similar to the fifth embodiment, the upper and lower electrode substrates 1001a and 1001c are grounded, and a negative voltage is applied to the intermediate electrode substrate 1001b, obtaining lens action on a charged beam such as an electron beam. When a conductive material is employed as the adhesive 1002a and fixing member 1002b serving as a coupling portion, a conductor suffices to be connected to either of the upper and lower electrode substrates 1001a and 1001c, simplifying wiring.

In this fashion, the upper and lower electrode substrates 1001a and 1001c are coupled using the fixing members 1002b. Even if the interval between the substrates 1001a and 1001b is large (large enough to hardly adhere them by, e.g., an adhesive), the substrates 1001a and 1001b can be easily coupled.

Figure 21:
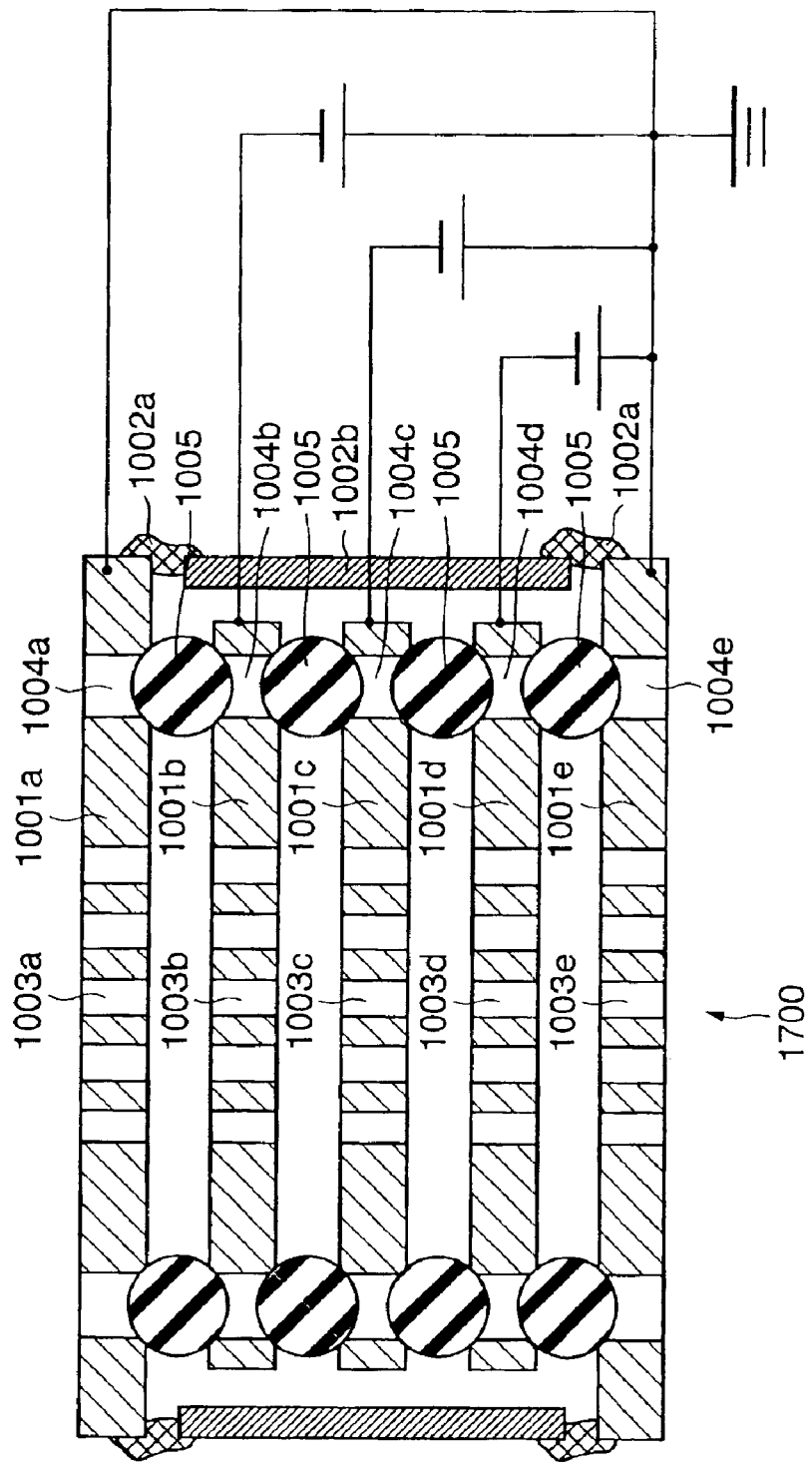
FIG. 21 is a sectional view for explaining the structure of the multi-charged beam lens according to the sixth embodiment of the present invention.

FIG. 20 shows an example of constituting a multi-charged beam lens by three electrode substrates. However, the number of electrode substrates is not limited to three and can be arbitrarily set. FIG. 21 is a sectional view showing a modification in which a multi-charged beam lens is comprised of five electrode substrates 1001a to 1001e having apertures 1003a to 1003e and grooves 1004a to 1004e. In a multi-charged beam lens 1700 shown in FIG. 21, the upper and lower electrode substrates 1001a and 1001e are coupled by the fixing members 1002b via the adhesive 1002a. The remaining electrode substrates 1001b, 1001c, and 1001d interposed between the upper and lower electrode substrates 1001a and 1001e are so arranged as not to be adhered to the upper and lower electrode substrates 1001a and 1001e, the adhesive 1002a, and the fixing member 1002b. The five electrode substrates 1001a to 1001e are positioned by interposing the insulator members 1005 between the grooves 1004a to 1004e formed in the electrode substrates 1001a to 1001e.

The exemplified multi-charged beam lens can also be applied to a charged beam exposure apparatus such as an electron beam exposure apparatus illustrated in FIG. 10, similar to the above-described embodiments. Such charged beam exposure apparatus is suitable for manufacturing a device such as a semiconductor device.

[Seventh Embodiment]

Figure 22:
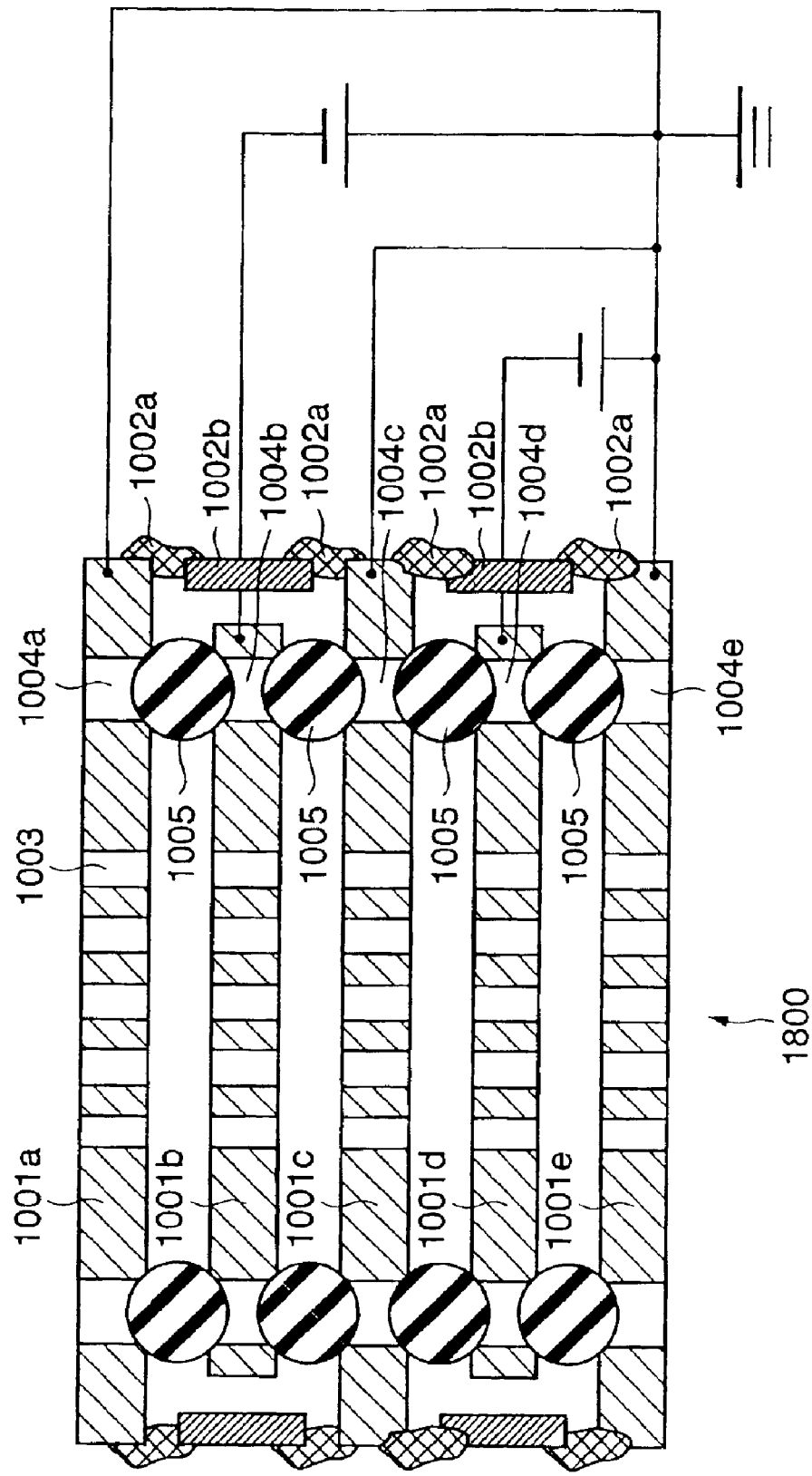
FIG. 22 is a sectional view for explaining the structure of a multi-charged beam lens according to the seventh embodiment of the present invention.

The seventh embodiment provides a concrete example in which three or more electrode substrates are coupled by a coupling member. FIG. 22 is a sectional view schematically showing the structure of a multi-charged beam lens according to the seventh embodiment of the present invention. A multi-charged beam lens 1800 shown in FIG. 22 is constituted by five, first to fifth electrode substrates 1001a to 1001e having apertures 1003a to 1003e and grooves 1004a to 1004e. As shown in FIG. 22, the same potential is applied to the first electrode (upper electrode) 1001a, third electrode 1001c, and fifth electrode (lower electrode) 1001e. A negative potential with respect to the potential of the first electrode (upper electrode) 1001a, third electrode 1001c, and fifth electrode (lower electrode) 1001e is applied to the second electrode 1001b and fourth electrode 1001d. Potentials applied to the second and fourth electrodes 1001b and 1001d may be the same or different.

The multi-charged beam lens 1800 shown in FIG. 22 has a function equivalent to a structure in which two multi-charged beam lenses 1100 as shown in FIG. 18 are stacked.

The first electrode (upper electrode) 1001a, third electrode 1001c, and fifth electrode (lower electrode) 1001e which receive the same potential are coupled by fixing members 1002b via an adhesive 1002a. Instead of this coupling method, a structure using only the adhesive as a coupling portion may be adopted. By coupling via the coupling portion the first electrode (upper electrode) 1001a, third electrode 1001c, and fifth electrode (lower electrode) 1001e which receive the same potential, no dielectric breakdown occurs in the member for assembling the first to fifth electrodes 1001a to 1001e.

A method of fabricating the multi-charged beam lens 1800 shown in FIG. 22 will be described. A method of fabricating the electrode substrates 1001a to 1001e is the same as that described in the fifth embodiment with reference to FIGS. 19A to 19D.

The assembly of the electrode substrates 1001a to 1001e is executed as follows. Insulator members 1005 are interposed between the groove 1004a of the first substrate 1001a and the groove 1004b of the second electrode substrate 1001b, between the groove 1004b of the second substrate 1001b and the groove 1004c of the third electrode substrate 1001c, between the groove 1004c of the third substrate 1001c and the groove 1004d of the fourth electrode substrate 1001d, and between the groove 1004d of the fourth substrate 1001d and the groove 1004e of the fifth electrode substrate 1001e. The first, third, and fifth electrodes 1001a, 1001c, and 1001e which receive the same potential are coupled by the fixing members 1002b via the adhesive 1002a.

Figure 23:
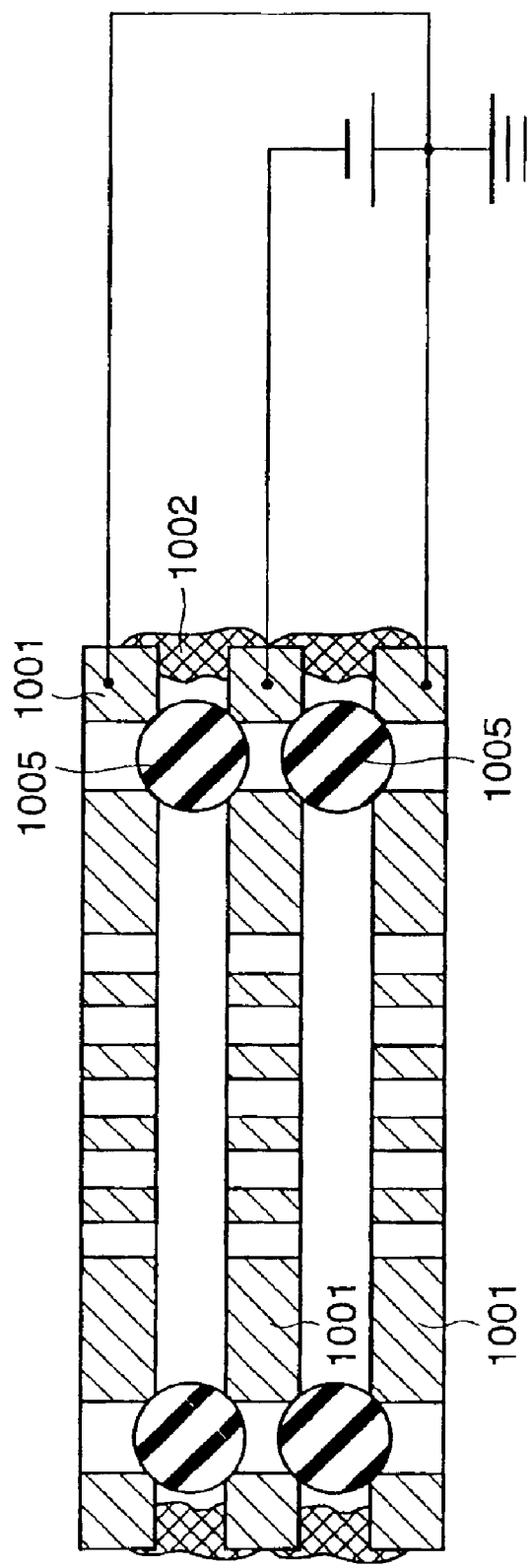
FIG. 23 is a sectional view for explaining a conventional charged beam lens.

In the multi-charged beam lens 1800 shown in FIG. 23, the first, third, and fifth electrodes 1001a, 1001c, and 1001e are grounded, and a negative voltage is applied to the second and fourth electrodes 1001b and 1001d, obtaining lens action on a charged beam such as an electron beam. When a conductive material is employed as the adhesive 1002a and fixing member 1002b serving as a coupling portion, a conductor suffices to be connected to any one of the first, third, and fifth electrodes 1001a, 1001c, and 1001e, simplifying wiring.

The arrangement of the multi-charged beam lens having a two-stage structure has been exemplified. The repetitive number of structures can be increased, and a multi-charged beam lens having a structure of three or more stages can be fabricated.

In the seventh embodiment, one multi-charged beam lens is comprised of three electrode substrates (though an electrode substrate is shared between stages). One multi-charged beam lens may be constituted by a different number of electrode substrates.

The exemplified multi-charged beam lens can also be applied to a charged beam exposure apparatus such as an electron beam exposure apparatus illustrated in FIG. 10, similar to the above-described embodiments. Such charged beam exposure apparatus is suitable for manufacturing a device such as a semiconductor device.

The manufacture of a microdevice using the multi-charged beam exposure apparatus described in the above embodiments will be explained.

Figure 24:
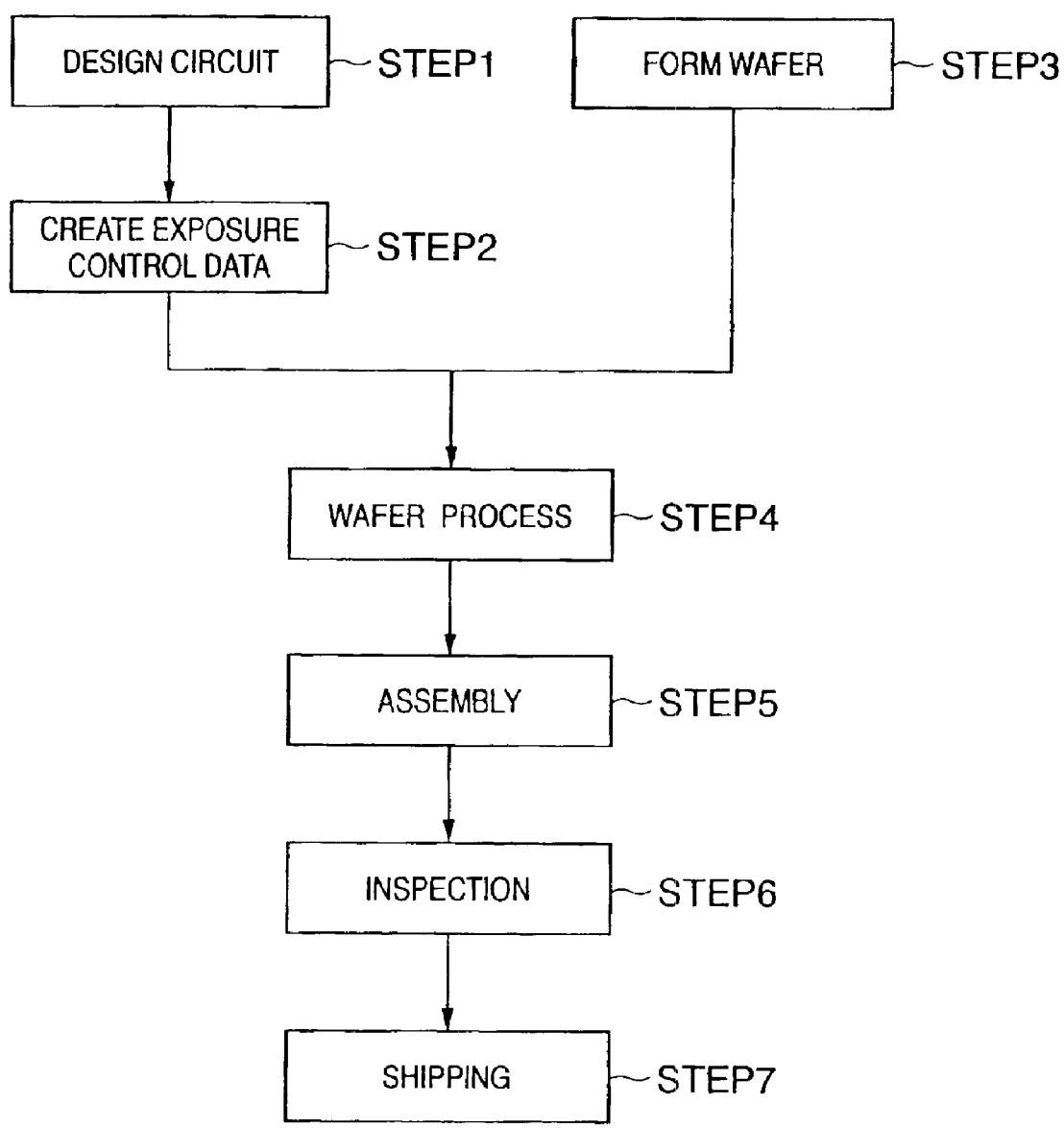
FIG. 24 is a flow chart for explaining the manufacturing flow of a microdevice.

FIG. 24 is a flow chart showing the manufacturing flow of a microdevice (semiconductor chip such as an IC or LSI, a liquid crystal panel, a CCD, a thin-film magnetic head, a micromachine, or the like). In step 1 (circuit design), a semiconductor device circuit is designed. In step 2 (exposure control data creation), exposure control data of the exposure apparatus is created on the basis of the designed circuit pattern. In step 3 (wafer formation), a wafer is formed using a material such as silicon. In step 4 (wafer process) called a pre-process, an actual circuit is formed on the wafer by lithography using the wafer and the exposure apparatus which has received the prepared exposure control data. Step 5 (assembly) called a post-process is the step of forming a semiconductor chip by using the wafer formed in step 4, and includes an assembly process (dicing and bonding) and packaging process (chip encapsulation). In step 6 (inspection), the semiconductor device manufactured in step 5 undergoes inspections such as an operation confirmation test and durability test. After these steps, the semiconductor device is completed and shipped (step 7).

Figure 25:
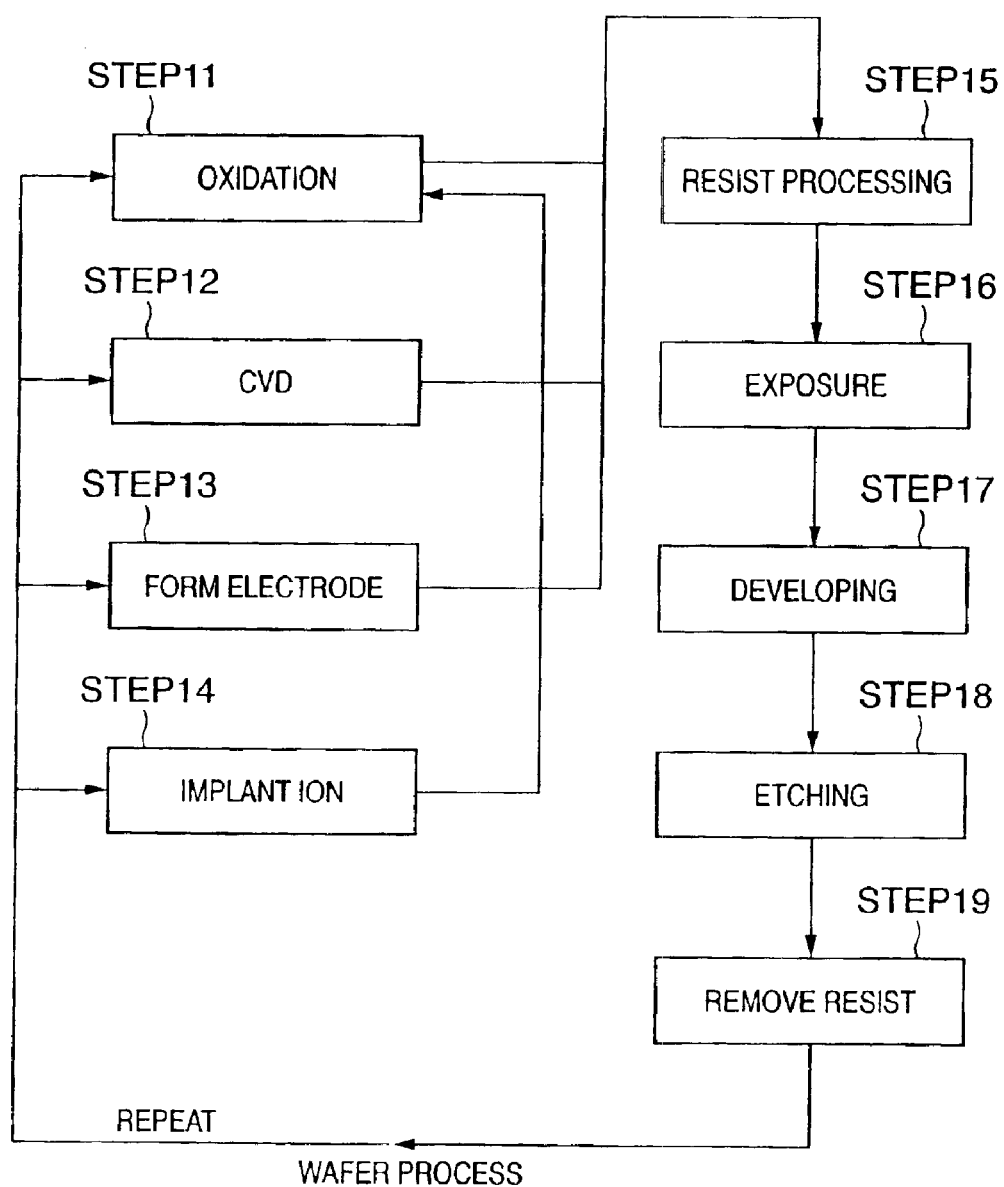
FIG. 25 is a flow chart for explaining details of the wafer process in FIG. 24.

FIG. 25 is a flow chart showing the detailed flow of the wafer process in FIG. 24. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus exposes the wafer to the circuit pattern. In step 17 (developing), the exposed wafer is developed. In step 18 (etching), the resist is etched except the developed resist image. In step 19 (resist removal), an unnecessary resist after etching is removed. These steps are repeated to form multiple circuit patterns on the wafer.

The manufacturing method of the embodiment can manufacture at low cost a high-integration-degree semiconductor device which is difficult to manufacture by the prior art.

The present invention can prevent dielectric breakdown in a member for assembling a plurality of electrode substrates.

As many apparently widely different embodiments of the present invention can be made without departing from the spirit and scope thereof, it is to be understood that the invention is not limited to the specific embodiments thereof except as defined in the claims.

What is claimed is:

1. A multi-charged beam lens constituted by stacking, via insulator members along an optical path of a charged beam, a plurality of electrodes having a charged beam passing region where a plurality of charged beam apertures are formed, comprising in a pair of electrodes which sandwich the insulator member:
   an aperture which is formed between the charged beam passing region and the insulator member in a surface of at least one electrode that faces the other electrode; and
   a conductive shield which enters the aperture and is arranged between the charged beam passing region and the insulator member without contacting the electrode having the aperture.

2. The lens according to claim 1, wherein
   all the plurality of electrodes have through holes as the aperture, and
   the conductive shield extends through the through holes of all the electrodes.

3. The lens according to claim 2, wherein the plurality of electrodes and the insulator members interposed between the electrodes are integrated by a clamp.

4. The lens according to claim 3, wherein a position where the clamp clamps the plurality of electrodes includes a position where the insulator members are aligned in a stacking direction.

5. The lens according to claim 3, wherein the conductive shield is fixed to the clamp.

6. The lens according to claim 1, wherein the conducive shield includes a metal.

7. The lens according to claim 1, wherein
   the conductive shield is formed as a projection on one of the pair of electrodes out of the plurality of electrodes, and
   the conductive shield enters the aperture of the other electrode.

8. The lens according to claim 1, wherein
   the plurality of electrodes include a first electrode having a through hole as the aperture, and two second electrodes which sandwich the first electrode and has projections as the conductive shield, and
   the projections of the second electrodes contact each other via the through hole of the first electrode.

9. The lens according to claim 1, wherein
   at least one of the pair of electrodes has a projection as the conductive shield, and
   the other electrode has a recess as the aperture in a region including a portion nearest to the projection.

10. The lens according to claim 9, wherein the shield exists around the optical path of the charged particle beam.

11. The lens according to claim 9, wherein the shield includes shields axially symmetrical about the optical path of the charged particle beam.

12. The lens according to claim 9, wherein at least one of the plurality of electrodes has both the projection and the recess.

13. A multi-charged beam lens comprising:
   at least three electrode substrates each having a plurality of apertures for transmitting a charged beam; and
   a coupling portion which couples at least two electrode substrates that receive a common potential out of said at least three electrode substrates,
   wherein the coupling portion is so arranged as not to contact the electrode substrate which receives a potential different from the common potential out of said at least three electrode substrates.

14. The lens according to claim 13, wherein the coupling portion includes an adhesive.

15. The lens according to claim 13, wherein the coupling portion includes
   a fixing member, and
   an adhesive which adheres the fixing member and said at least two electrode substrates that receive the common potential.

16. The lens according to claim 13, further comprising insulator members which are interposed between said at least three electrode substrates so as to position said at least three electrode substrates.

17. The lens according to claim 16, wherein said at least three electrode substrates have positioning grooves, and the insulator members are arranged in the grooves.

18. The lens according to claim 13, wherein the coupling portion is formed from a conductive material.

19. A charged beam exposure apparatus comprising a multi-charged beam lens defined in claim 1, wherein a pattern is drawn on a substrate with a charged beam from the multi-charged beam lens.

* * * * *

UNITED STATES PATENT AND TRADEMARK OFFICE
CERTIFICATE OF CORRECTION

PATENT NO.     : 6,946,662 B2
DATED          : September 20, 2005
INVENTOR(S)    : Haruhito Ono et al.

It is certified that error appears in the above-identified patent and that said Letters Patent is hereby corrected as shown below:

Title page,
Item [56], References Cited, OTHER PUBLICATIONS, "K.Y. Lee et al.," reference, "Sci," should read -- Sci. --.

Column 1,
Line 10, "method," should read -- method; --;
Line 15, "be also" should read -- also be --;
Line 22, "candidate of" should read -- candidate for --;
Line 47, "one of" should read -- one of the --; and
Line 53, "arts" should read -- art --.

Column 2,
Lines 8 and 22, "arts" should read -- art --;
Line 56, "formed" should read -- formed, --; and
Line 57, "member" should read -- member: --.

Column 3,
Line 3, "comprising" should read -- comprising: --.

Column 6,
Line 1, "corrects in advance" should read -- corrects, in advance --.

Column 7,
Line 23, "three, upper" should read -- three electrodes (upper --; and
Line 24, "LE" should read -- LE, respectively.) --.

Column 9,
Line 35, "above-describe" should read -- above-described --;
Line 46, "(STRIPEL)" should read -- (STRIPE 1) --; and
Line 61, "staking" should read -- stacking --.

UNITED STATES PATENT AND TRADEMARK OFFICE
CERTIFICATE OF CORRECTION

PATENT NO. : 6,946,662 B2
DATED : September 20, 2005
INVENTOR(S) : Haruhito Ono et al.

It is certified that error appears in the above-identified patent and that said Letters Patent is hereby corrected as shown below:

<u>Column 18,</u>
Line 26, "has" should read -- have --; and
Line 59, "includes" should read -- includes: --.

Signed and Sealed this

Second Day of May, 2006

JON W. DUDAS
*Director of the United States Patent and Trademark Office*